United States Patent
Yoshioka

(10) Patent No.: US 6,674,683 B2
(45) Date of Patent: Jan. 6, 2004

(54) SERIAL ACCESS MEMORY

(75) Inventor: Shigemi Yoshioka, Yamanashi (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/259,598

(22) Filed: Sep. 30, 2002

(65) Prior Publication Data

US 2003/0103389 A1 Jun. 5, 2003

Related U.S. Application Data

(62) Division of application No. 09/926,442, filed on Sep. 26, 2001, now Pat. No. 6,608,794.

(30) Foreign Application Priority Data

Sep. 29, 2000 (JP) ........................................ 2000-299673

(51) Int. Cl.⁷ .............................................. G11C 8/00
(52) U.S. Cl. ............................ 365/230.03; 365/230.06; 365/189.01
(58) Field of Search ............................. 365/230.03, 190, 365/231, 189.01, 230.06, 189.04

(56) References Cited

U.S. PATENT DOCUMENTS

| | | | |
|---|---|---|---|
| 4,703,453 A | * 10/1987 | Shinoda et al. ............. | 365/104 |
| 6,005,820 A | 12/1999 | Imondi et al. | |
| 6,118,729 A | 9/2000 | Hirabayashi et al. | |
| 6,278,644 B1 | 8/2001 | Takasugi | |

* cited by examiner

Primary Examiner—Thong Quoc Le
(74) Attorney, Agent, or Firm—Volentine Francos, PLLC

(57) ABSTRACT

A serial access memory low in current consumption, capable of restraining an increase in chip size even if memory capacity increases. The serial access memory has a first and a second memory arrays each having memory cells electrically connected to corresponding bit lines, signal lines provided in common between the memory arrays and electrically connected to the corresponding bit lines through first transfer circuits, write registers electrically connected to the corresponding signal lines through a second transfer circuit, a write bus electrically connected to the write registers through a third transfer circuit, an input circuit electrically connected to the write bus, read registers electrically connected to the corresponding signal lines through a fourth transfer circuit, a read bus electrically connected to the read registers through a fifth transfer circuit, and an input circuit electrically connected to the read bus.

17 Claims, 20 Drawing Sheets

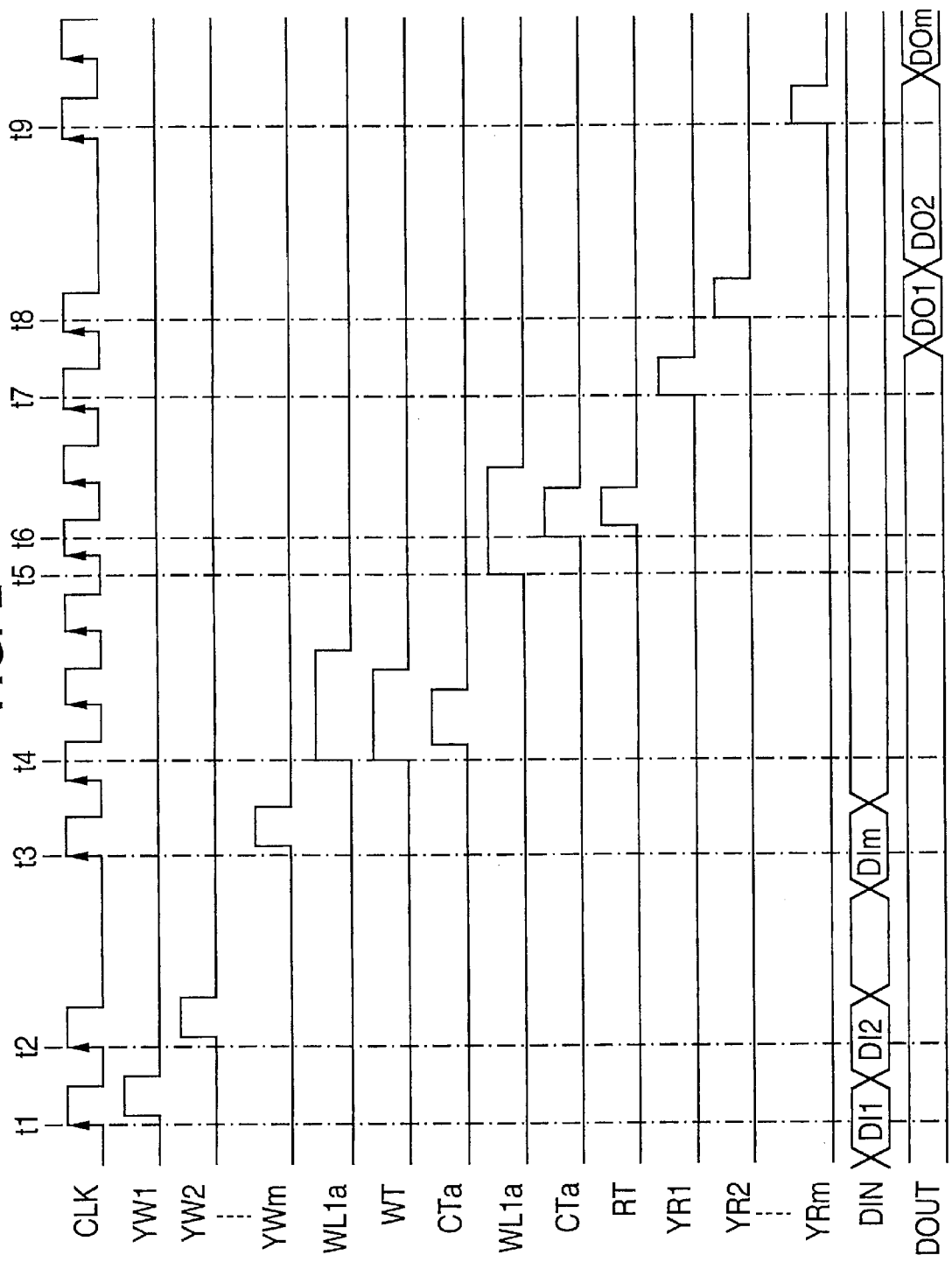

SERIAL ACCESS MEMORY

CROSS REFERENCE TO RELATED APPLICATIONS

This is a divisional application of application Ser. No. 09/926,442, filed Sep. 26, 2001 now U.S. Pat. No. 6,608,794 which is hereby incorporated by reference in its entirety for all purposes.

BACKGROUND OF THE INVENTION

1. Field of the Invention

The present invention relates to a serial access memory, and particularly to transfer units set as paths used when data stored in memory cells are respectively transferred to read and write registers.

2. Description of the Related Art

Each of memory blocks of a serial access memory adopts a configuration wherein read registers and write registers are respectively added to memory cells of a DRAM. The memory capacity of such a memory block is normally taken up or configured in units of 256 Kbits or 512 Kbits, for example to ensure an operating margin for each memory and reduce the peak of current consumption. Since the serial access memory often deals with image data, it needs to have a capacity of a few Mbits. In order to implement it through the use of the above memory block, the serial access memory is made up of a plurality of memory blocks.

With the recent scale-down technology, the memory cell can be formed greatly by shortening it. However, the read registers and write registers are not scaled down in a manner similar to the memory cells. Thus, although the occupied area of each memory cell in a memory block is reduced, the read registers and write registers are not so scaled down. Accordingly, a problem arises in that the serial access memory has not yet been scaled down in chip size as might be expected. Further, since the conventional serial access memory comprises the plurality of memory blocks including the write and read registers, circuits for controlling the respective registers and transfer units increase in number, thus increasing current consumption.

SUMMARY OF THE INVENTION

An object of the present invention is to provide a serial access memory low in current consumption, which is capable of restraining an increase in chip size even if memory capacity increases.

A serial access memory of the present invention comprises first and second memory arrays. The first memory array includes first memory cells, first sense amplifiers and pairs of first bit lines connected to the first memory cells and the first sense amplifiers. The second memory array includes second memory cells, second sense amplifiers and second bit lines connected to the second memory cells and the second sense amplifiers. The serial memory further comprises pairs of column lines each of which is connected to one of the pairs of first bit lines and one of the pairs of the second bit lines, write registers each of which is connected to one of the pairs of column lines, a write address accessing circuit connected to the write registers for selecting one of said write registers, read registers each of which is connected to one of the pairs of column lines, a read address accessing circuit connected to the read registers for selecting one of the read registers, an input circuit connected to the write registers, and an output circuit connected to the write registers.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 2 is a timing chart for describing operating timings for the serial access memory according to the first embodiment of the present invention;

DETAILED DESCRIPTION OF THE PREFERRED EMBODIMENTS

Preferred embodiments of the present invention will hereinafter be described in detail with reference to the accompanying drawings.

Figure 1A:
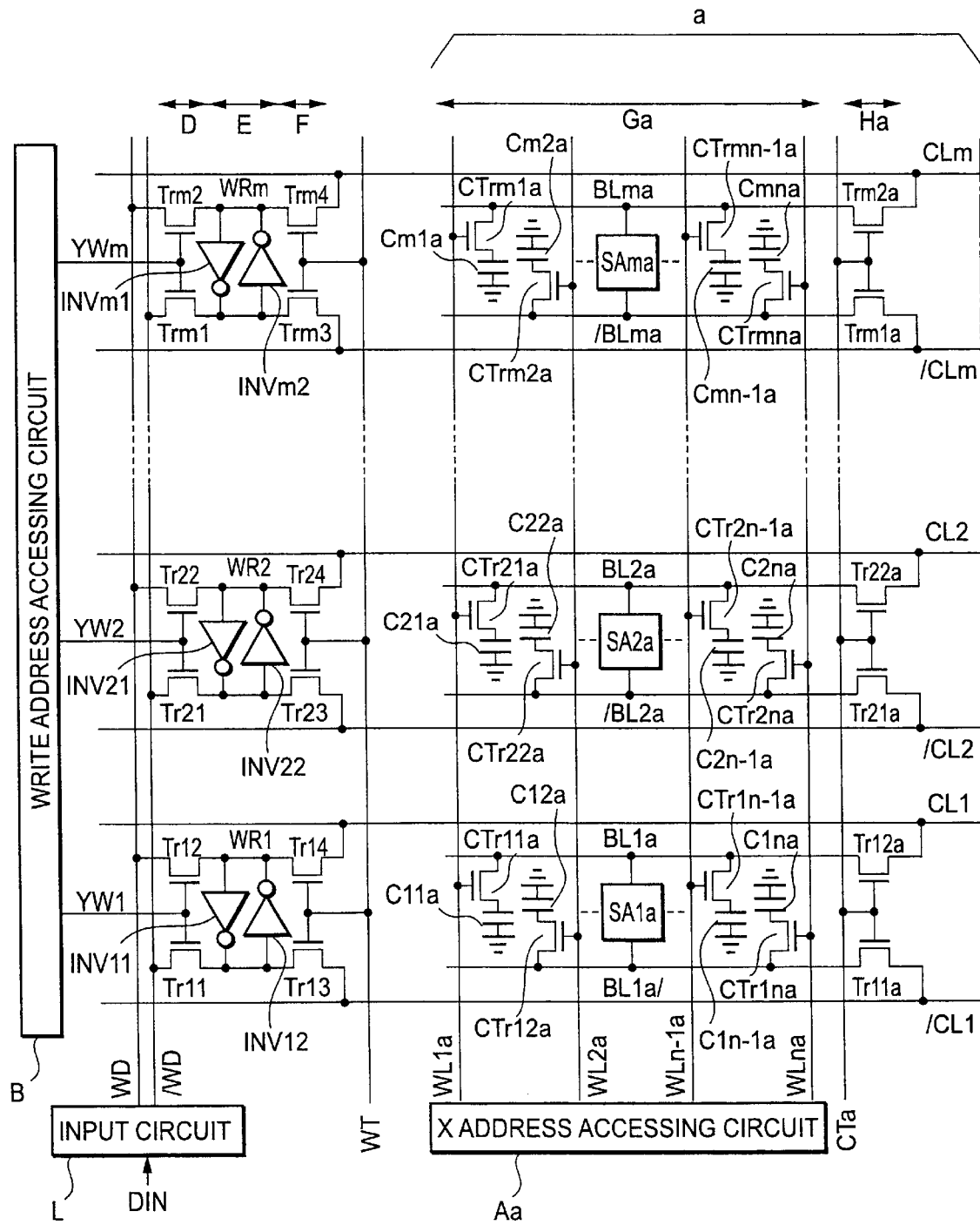
FIG. 1 is a simplified circuit diagram showing a circuit of a principal part of a serial access memory according to a first embodiment of the present invention.
Figure 1B:
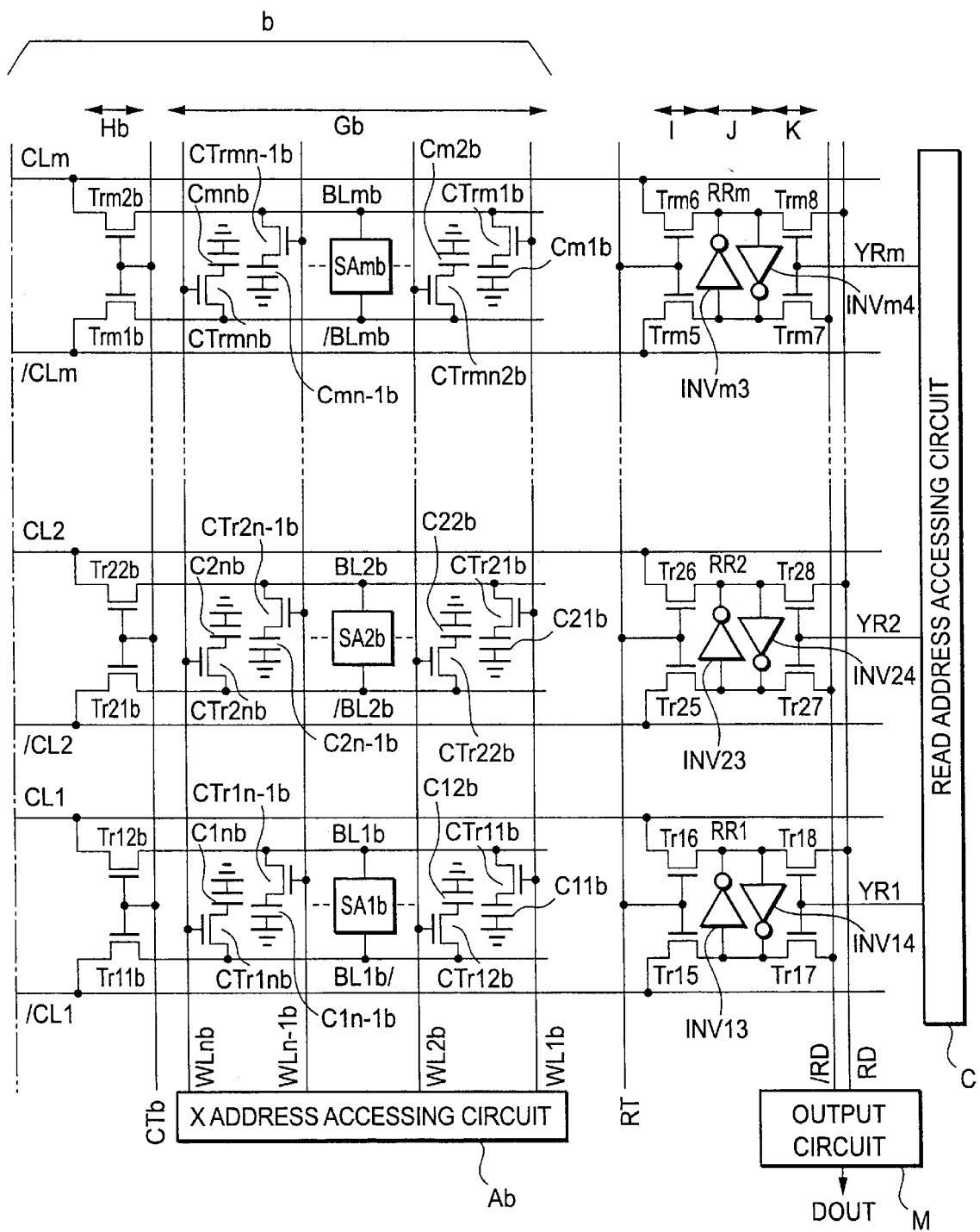

FIG. 1 is a simplified circuit diagram showing a circuit of a principal part of a serial access memory according to a first embodiment of the present invention. A configuration of the first embodiment will be explained below with reference to FIG. 1.

The serial access memory according to the present embodiment comprises two memory blocks (corresponding to a memory block a and a memory block b). The memory blocks a and b have a plurality of memory cells respectively. The memory cells comprise memory cell transistors CTrija or CTrijb (where i=1 to m, j=1 to n, and m and n are whole numbers) and capacitors Cija or Cijb respectively. First ends of the capacitors Cija or Cijb are electrically connected to their corresponding first terminals of the memory cell transistors CTrija or CTrijb, whereas the other ends thereof are respectively electrically connected to a predetermined source or power supply (ground potential in the first embodiment).

Second terminals of the memory cell transistors CTrija or CTrijb are respectively electrically connected to bit lines BLia, /BLia, BLib or /BLib, and the gates thereof are respectively electrically connected to word lines WLja or WLjb.

As to the memory cell, for example, one connected to a pair of bit lines BLma and BLma/ is considered as one column unit. Each of sense amplifiers SAia is provided for each column unit. The sense amplifiers SAia or SAib are respectively electrically connected between each individual pairs of bit lines BLia and /BLia or between BLib and /BLib. These memory cells, sense amplifiers SAia or SAib, bit lines BLia, /BLia, BLib or /BLib and word lines WLja or WLib constitute either a memory cell array Ga or Gb. Incidentally, the word lines WLja or WLjb are electrically connected to either an X address accessing circuit Aa or Ab. The X address accessing circuit Aa (or Ab) selects only one word line WLja (or WLjb) from the word lines WLja (or WLjb) in response to an unillustrated address signal.

The bit lines pairs BLia and /BLia or BLib and /BLib set in column units are electrically connected to their corresponding pairs of signal lines CLi and /CLi which are parallel to the bit lines BLia, /BLia, BLib or /BLib and common to the memory blocks a and b through transfer circuit Ha or Hb. Either the transfer circuit Ha of the memory block a or the transfer circuit Hb of the memory block b comprises transfer transistor pairs Tri1$a$ and Tri2$a$ or Tri1$b$ and Tri2$b$. These transfer transistors Tri1$a$,Tri2$a$,Tri1$b$ or Tri2$b$ have first terminals electrically connected to their corresponding bit lines BLia, /BLia, BLib or /BLib, second terminals electrically connected to their corresponding signal lines CLi and /CLi, and gates respectively commonly supplied with a transfer signal CTa or CTb.

Read registers RRi and write registers WRi are respectively electrically connected to both ends of the signal lines CLi and /CLi through transfer circuits I and F. The read registers RRi and write registers WRi respectively comprise two inverters whose inputs and outputs are respectively connected to one another. Further, the transfer circuits F and I respectively comprise transistor pairs Tri3 and Tri4 or Tri5 and Tri6. The transfer transistors Tri3 or Tri4 respectively have first terminals electrically connected to their corresponding write registers WRi, second terminals electrically connected to their corresponding signal lines CLi and /CLi, and gates commonly supplied with a write transfer signal WT. Further, the transfer transistors Tri5 or Tri6 respectively have first terminals electrically connected to their corresponding read registers RRi, second terminals electrically connected to their corresponding signal lines CLi and /CLi, and gates commonly supplied with a read transfer signal RT.

The write registers WRi are also respectively electrically connected to write data buses WD and /WD through a transfer circuit D. The transfer circuit D comprises transfer transistor pairs Tri1 and Tri2. First terminals of the transfer transistors Tri1 and Tri2 are respectively electrically connected to the write registers WRi, second terminals thereof are respectively electrically connected to the write data buses WD and /WD, and the gates thereof are respectively commonly supplied with address signals YWm. The address signals YWm are generated by a write address accessing circuit B. The write address accessing circuit B activates only one address signal YWm in response to an unillustrated address signal. Thus, data on the write data buses WD and /WD are read into the write registers WRi connected to the transfer transistor pairs Tri1 and Tri2 supplied with the activated address signal YWm, respectively.

An input circuit L is electrically connected to the write data buses WD and /WD. The input circuit L receives data DIN inputted from the outside therein and outputs it to the write data buses WD and /WD.

The read registers RRi are also electrically connected to read data buses RD and /RD through a transfer circuit K. The transfer circuit K comprises transfer transistor pairs Tri7 and Tri8. First terminals of the transfer transistors Tri7 and Tri8 are respectively electrically connected to the read registers RRi, second terminals thereof are respectively electrically connected to the read data buses RD and /RD, and the gates thereof are respectively commonly supplied with address signals YRm. The address signals YRm are generated by a read address accessing circuit C. The read address accessing circuit C activates only one address signal YRm in response to an unillustrated address signal. Thus, only data stored in the read registers RRi connected to the transfer transistor pairs Tri7 and Tri8 supplied with the activated address signal YRm are read into the read data buses RD and /RD, respectively.

An output circuit M is electrically connected to the read data buses RD and /RD. The output circuit M outputs the data outputted to the read data buses RD and /RD to the outside as output data DOUT.

FIG. 2 is a timing chart for describing timings provided to operate the serial access memory according to the first embodiment of the present invention. The operating timings for the serial access memory according to the first embodiment will be explained below using FIG. 2 according to times t1 through t9 shown in FIG. 2. Incidentally, an actual serial access memory is capable of performing a serial write operation and a serial read operation in asynchronous form perfectly except for a data transfer cycle. However, FIG. 2 shows a state in which serial write and read operations have been performed at different times to make it easy to understand their description.

FIG. 2 also shows a state in which only the memory block a is in operation. It is however needless to say that only the memory block b can be activated and the memory blocks a and b can be activated simultaneously.

<Time t1>

The input circuit L captures data DI1 from input data DIN and transfers it to the write data buses WD and /WD. The write address accessing circuit B selectively activates an address signal YW1. Thus, the transfer transistors Tr11 and Tr12 of the transfer circuit D are selectively turned on so that the write register WR1 is electrically connected to the write data buses WD and /WD. Accordingly, the data DI1 is written into the write register WR1.

<Time t2>

The input circuit L brings data DI2 from the input data DIN and transfers it to the write data buses WD and /WD. The write address accessing circuit B selectively activates an address signal YW2. Thus, the transfer transistors Tr21 and Tr22 of the transfer circuit D are selectively turned on so that the write register WR2 is electrically connected to the write data buses WD and /WD. Accordingly, the data DI2 is written into the write register WR2.

<Time T3>

The input circuit L takes in data DIm from the input data DIN and transfers it to the write data buses WD and /WD. The write address accessing circuit B selectively activates an address signal YWm. Thus, the transfer transistors Trm1 and Trm2 of the transfer circuit D are selectively turned on so that the write register WRm is electrically connected to the write data buses WD and /WD. Accordingly, the data DIm is written into the write register WRm.

<Time t4>

After the writing of the data into the write registers WRi has been completed, the written data DI1 through DIm are written into the memory array Ga at a time t4.

At first, the X address accessing unit Aa selects the corresponding word line WL1a (which is tentatively set as WL1a for explanation herein) and supplies a signal of a high level to the word line WL1a. Thus, the memory cell transistor CTri1a of the corresponding memory cell connected to the word line WL1a is turned on, so that the memory cell is brought to a selected state.

Since the write transfer signal WT is brought to a high level simultaneously, the transfer transistors Tri3 and Tri4 are turned on. Thus, the data written into the write registers WRi are temporarily transferred onto their corresponding signal lines CLi and /CLi through the transfer transistors Tri3 and Tri4.

After the data have fully been transferred to the signal lines CLi and /CLi, the transfer signal CTa is rendered high in level. Thus, the transfer transistors Tri1a and Tri2a of the transfer circuit Ha are turned on so that the signal lines CLi and /CLi are electrically connected to their corresponding bit lines BLia and /BLia. Accordingly, the data on the signal lines CLi and /CLi are temporarily transferred to the bit lines BLia and /BLia. The transferred data are respectively amplified by the sense amplifiers SAia and thereafter stored in their corresponding capacitors Ci1a of the memory cells (corresponding to the memory cells whose memory cell transistors CTri1a are kept on) connected to the word line WL1a.

This series of operations is called "write transfer".

<Time t5>

At a time t5, the data written into the corresponding memory cell is read out.

The X address accessing circuit Aa selects the corresponding word line WL1a (which is tentatively set as WL1a for explanation herein) and supplies a high level signal to the word line WL1a. Thus, the memory cell transistors CTri1a of the memory cells connected to the word line WL1a are turned on so that the data stored in the capacitors Ci1a of the memory cells are transferred to their corresponding bit lines pairs BLia and /BLia. The sense amplifiers SAia respectively amplify the data on the bit line pairs BLia and /BLia.

<Time t6>

Since the transfer signal CTa is rendered high in level, the transfer transistors Tri1a and Tri2a of the transfer circuit Ha are turned on so that the signal lines CLi and /CLi are electrically connected to their corresponding bit line pairs BLia and /BLia. Thus, the data on the bit line pairs BLia and /BLia, which have been amplified by the sense amplifiers SAia, are temporarily transferred onto the signal lines CLi and /CLi through the transfer transistors Tri1a and Tri2a.

Afterwards, the read transfer signal RT is rendered high in level. Thus, the transfer transistors Tri5 and Tri6 of the transfer circuit I are turned on so that the signal lines CLi and /CLi are electrically connected to their corresponding read registers RRi. Accordingly, the data on the signal lines CLi and /CLi are respectively written into the read registers RRi.

This series of operation is called "read transfer".

<Time t7>

The data transferred from the memory block a to its corresponding read register J are temporarily stored in the read register J according to the read transfer operation. Thereafter, the address YR1 of the outputs produced from the read address accessing circuit C is brought to a high level. Thus, the transfer transistors Tr17 and Tr18 are turned on so that the data stored in the read register RR1 is transferred to the read data buses RD and /RD. The transferred data is transferred to the output circuit M from which it is outputted as data DO1 of the output data DOUT.

<Time t8>

The address YR2 of the outputs produced from the read address accessing circuit C is brought to a high level. Thus, the transfer transistors Tr27 and Tr28 are turned on so that the data stored in the read register RR2 is transferred to the read data buses RD and /RD. The transferred data is transferred to the output circuit M from which it is outputted as data DO2 of the output data DOUT.

<Time t9>

The address YRm of the outputs produced from the read address accessing unit C is brought to a high level. Thus, the transfer transistors Trm7 and Trm8 are turned on so that the data stored in the read register RRm is transferred to the read data buses RD and /RD. The transferred data is transferred to the output circuit M from which it is outputted as data DOm of the output data DOUT.

Since the read and write registers are respectively provided one by one (by one set) with respect to the plurality of memory blocks in the serial access memory according to the first embodiment of the present invention as described above, a substantial reduction in chip size can be achieved.

Further, since the write and read registers can be reduced in number as compared with the prior art, it is possible to restrain an increase in the number of peripheral circuits and implement a reduction in power consumption.

Figure 3A:
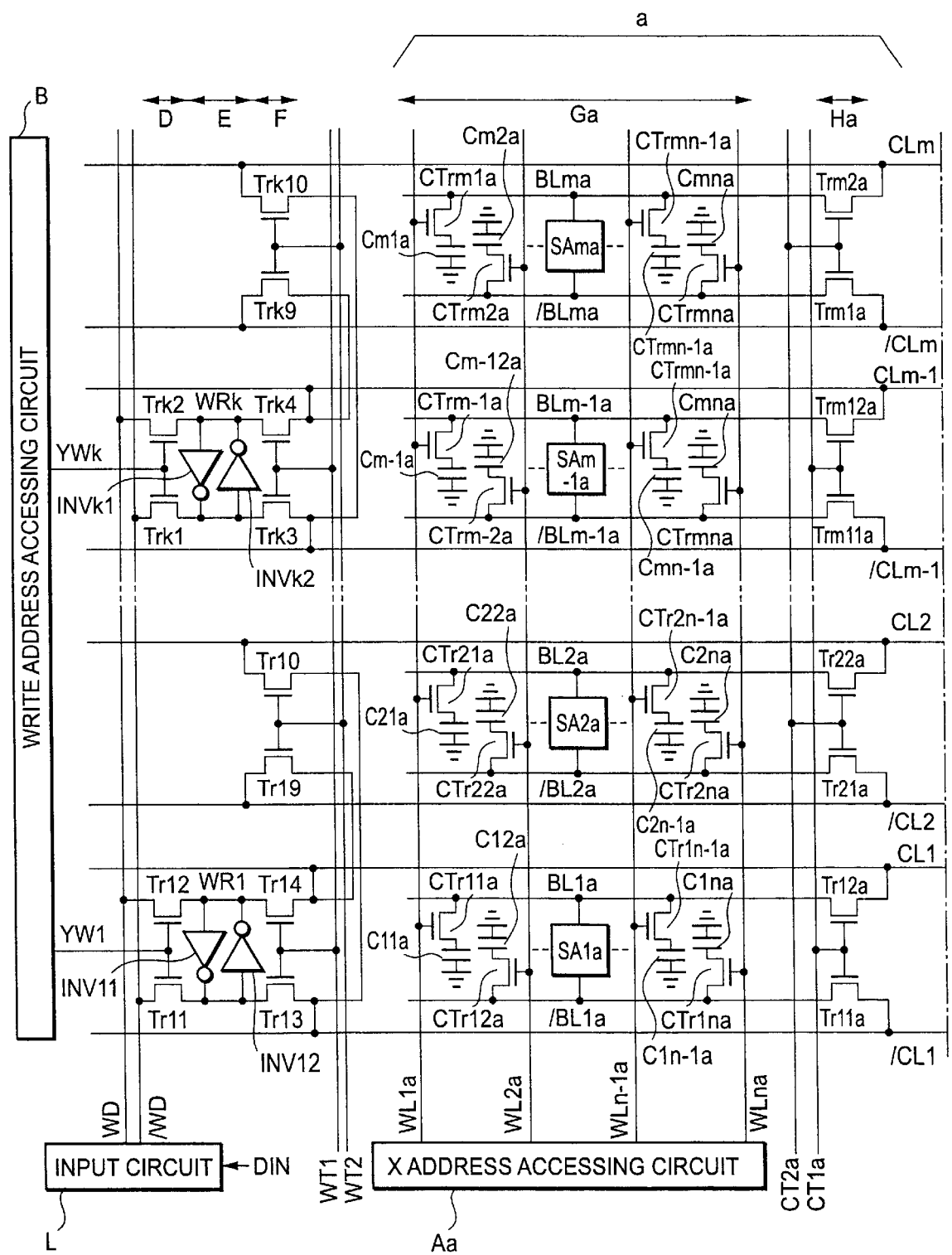
FIG. 3 is a simplified circuit diagram illustrating a circuit of a principal part of a serial access memory according to a second embodiment of the present invention.
Figure 3B:
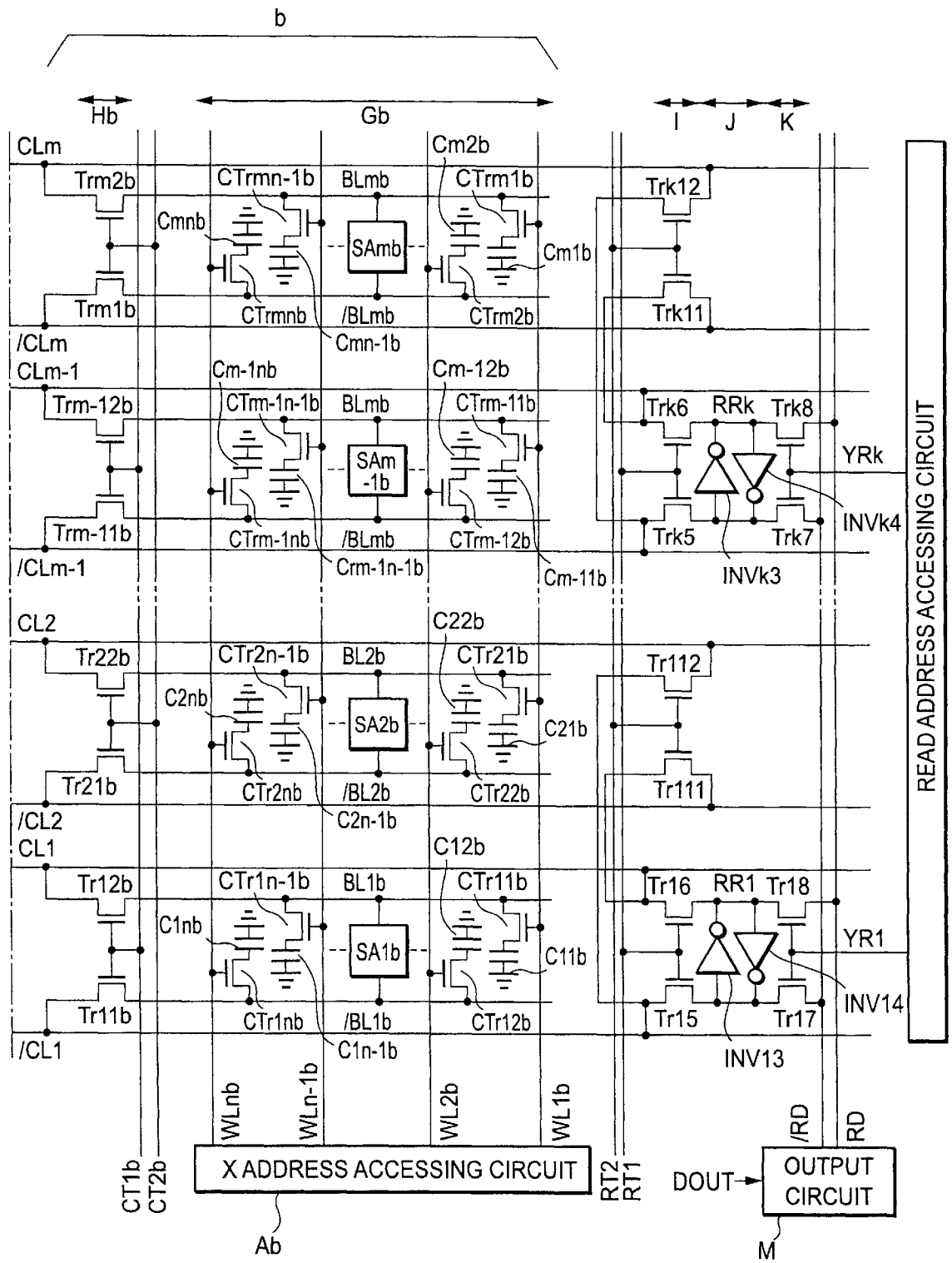

FIG. 3 is a simplified circuit diagram showing a circuit of a principal part of a serial access memory according to a second embodiment of the present invention. A configuration of the second embodiment will be explained below with reference to FIG. 3. In FIG. 3, the same portions as those shown in FIG. 1 are identified by the same reference numerals and the description thereof will therefore be omitted.

The second embodiment is similar to the first embodiment in that the serial access memory according to the present embodiment comprises two memory blocks a and b. However, transfer control for controlling transfer circuits Ha and Hb are respectively performed based on two transfer signals CT1a and CT2a, and CT1b and CT2b. The transfer signal CT1a is supplied to the gates of odd-numbered transfer transistors (e.g., Tr11a and Tr12a) of the transfer circuit, whereas the transfer signal CT2a is supplied to the gates of even-numbered transfer transistors (e.g., Tr21a and Tr22a) of the transfer circuit. Similarly, the transfer signal CT1b is supplied to the gates of odd-numbered transfer transistors (e.g., Tr11b and Tr12b) of the transfer circuit, whereas the transfer signal CT2b is supplied to the gates of even-numbered transfer transistors (e.g., Tr21b and Tr22b) of the transfer circuit.

Read registers RRi and write registers WRi are respectively electrically connected to both ends of odd-numbered signal lines (e.g., CL1 and /CL1) through transfer circuits I and F. On the other hand, the read registers and the write registers are respectively disconnected from both ends of even-numbered signal lines (e.g., CL2 and /CL2) and only the transfer circuits I and F are respectively connected thereto. The transfer circuits I and F connect the even-numbered signal lines (e.g., CL2 and /CL2) to the read registers RRi and the write registers WRi respectively electrically connected to both ends of the odd-numbered signal lines (e.g., CL1 and /CL1), respectively.

Of the transfer circuit F, transfer transistors (e.g., Tr13 and Tr14) respectively electrically connected to the odd-numbered signal lines (e.g., CL1 and /CL1) are controlled by a first write transfer signal WT1, and transfer transistors (e.g., Tr19 and Tr10) respectively electrically connected to the even-numbered signal lines (e.g., CL2 and /CL2) are controlled by a second write transfer signal WT2. Of the transfer circuit I, transfer transistors (e.g., Tr15 and Tr16) respectively electrically connected to the odd-numbered signal lines (e.g., CL1 and /CL1) are controlled by a first read transfer signal RT1, and transfer transistors (e.g., Tr111 and Tr112) respectively electrically connected to the even-numbered signal lines (e.g., CL2 and /CL2) are controlled by a second read transfer signal RT2.

Figure 4:
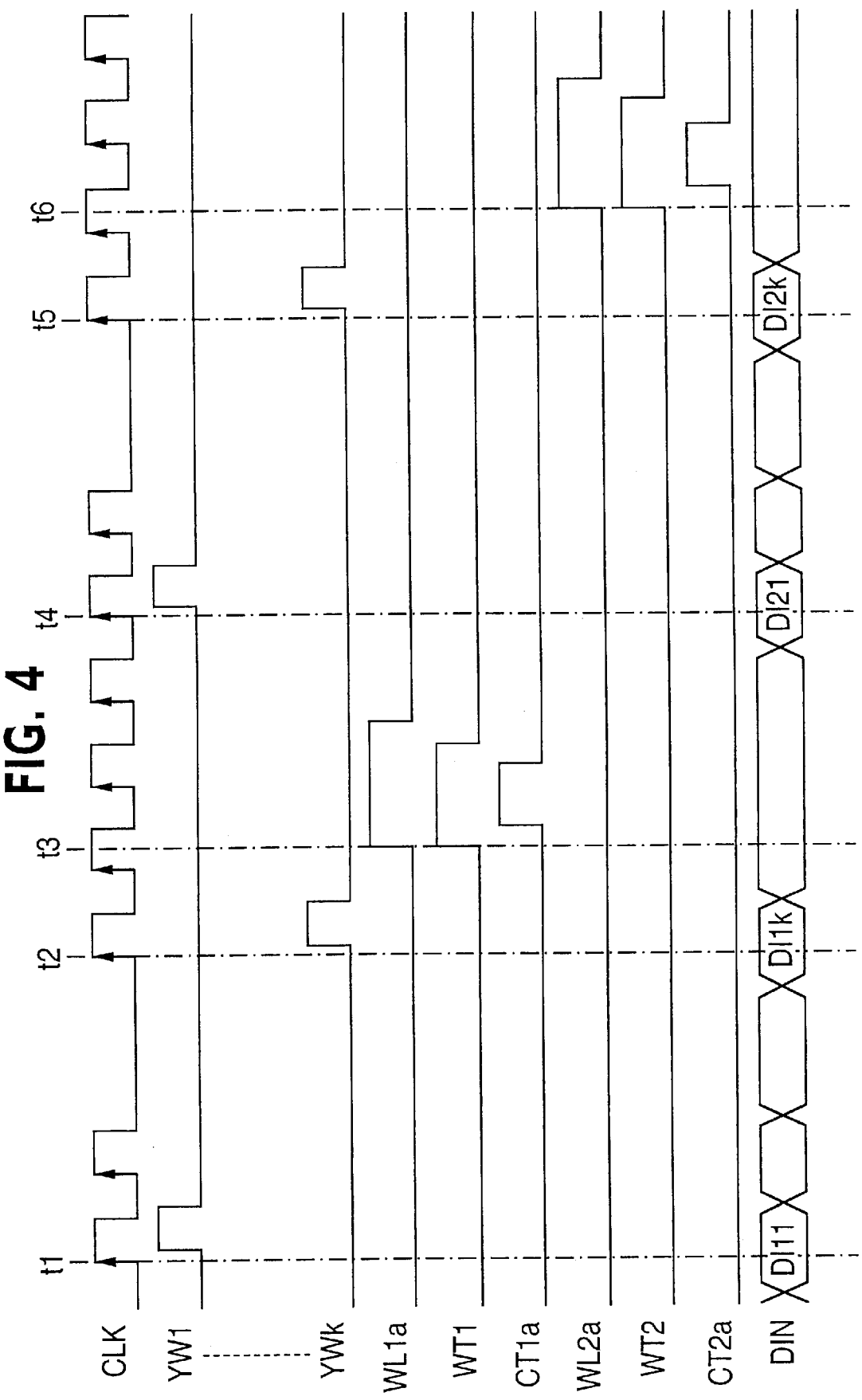
FIG. 4 is a timing chart for describing operating timings for the serial access memory according to the second embodiment of the present invention.

FIG. 4 is a timing chart for describing timings provided to operate the serial access memory according to the second embodiment of the present invention. The operating timings for the serial access memory according to the second embodiment will be explained below according to times t1 through t6 with reference to FIG. 4. Incidentally, FIG. 4 shows operating states for explanation regardless of an actual serial access memory in a manner similar to FIG. 2.

<Time t1>

An input circuit L captures data DI11 from input data DIN and transfers it to write data buses WD and /WD. A write address accessing circuit B selectively activates an address signal YW1. Thus, transfer transistors Tr11 and Tr12 of a transfer circuit D are selectively turned on to electrically connect the write register WR1 to the write data buses WD and /WD. Accordingly, the data DI11 is written into the write register WR1.

<Time t2>

The input circuit L brings data DI1$k$ from the input data DIN and transfers it to the write data buses WD and /WD. The write address accessing circuit B selectively activates an address signal YWk. Thus, transfer transistors Trk1 and Trk2 of the transfer circuit D are selectively turned on to electrically connect the write register WRk to the write data buses WD and /WD. Accordingly, the data DI1$k$ is written into the write register WRk.

<Time t3>

After the writing of the data into the write register WRk has been completed, the written data DI11 through DI1$k$ are written into their corresponding memory cells electrically connected to bit line pairs (e.g., BL1$a$ ad /BL1$a$) lying in odd sequences, of a memory array Ga at a time t3.

At first, an X address accessing circuit Aa selects the corresponding word line WL1$a$ (tentatively set as WL1$a$ for explanation herein) and supplies a signal of a high level to the word line WL1$a$. Thus, memory cell transistors CTri1$a$ of the memory cells connected to the word line WL1$a$ are turned on, thus bringing the memory cells to a selected state.

Since the first write transfer signal WT1 is brought to a high level simultaneously, the transfer transistors Tri3 and Tri4 are turned on. Thus, the data written into the write registers WRi are temporarily transferred onto their corresponding signal lines CLi and /CLi through the transfer transistors Trk3 and Trk4.

After the data have fully been transferred to the signal lines CLi and /CLi, the transfer signal CT1$a$ is rendered high in level. Thus, the transfer transistors Tri1$a$ and Tri2$a$ of the transfer circuit Ha are turned on to electrically connect the signal lines CLi and /CLi to their corresponding bit lines BLi$a$ and /BLi$a$. Accordingly, the data on the signal lines CLi and /CLi are temporarily transferred to the bit lines BLi$a$ and /BLi$a$. The transferred data are respectively amplified by sense amplifiers SAi$a$ and thereafter stored in their corresponding capacitors Ci1$a$ of the memory cells (corresponding to the memory cells whose memory cell transistors CTri1$a$ are kept on) connected to the word line WL1$a$.

<Time t4>

The input circuit L takes in data DI21 from the input data DIN and transfers it to the write data buses WD and /WD. The write address accessing circuit B selectively activates an address signal YW1. Thus, the transfer transistors Tr11 and Tr12 of the transfer circuit D are selectively turned on to electrically connect the write register WR1 to the write data buses WD and /WD. Accordingly, the data DI21 is written into the write register WR1.

<Time t5>

The input circuit L takes in data DI2$k$ from the input data DIN and transfers it to the write data buses WD and /WD. The write address accessing circuit B selectively activates an address signal YWk. Thus, the transfer transistors Trk1 and Trk2 of the transfer circuit D are selectively turned on to electrically connect the write register WRk to the write data buses WD and /WD. Accordingly, the data DI2$k$ is written into the write register WRk.

<Time t6>

After the writing of the data into the write register WRk has been completed, the written data DI21 through DI2$k$ are written into their corresponding memory cells electrically connected to bit line pairs (e.g., BL2$a$ and /BL2$a$) lying in even sequences, of the memory array Ga at a time t6.

At first, the X address accessing circuit Aa selects the corresponding word line WL2$a$ (tentatively set as WL2$a$ for explanation herein) and supplies a signal of a high level to the word line WL2$a$. Thus, memory cell transistors CTri2$a$ of the corresponding memory cells connected to the word line WL2$a$ are turned on, so that the memory cells are brought to a selected state.

Since the second write transfer signal WT2 is brought to a high level simultaneously, the transfer transistors (Tr19 and Tr10) are turned on. Thus, the data written into the write registers WRi are temporarily transferred onto their corresponding signal lines CLi and /CLi through the transfer transistors (e.g., Tr19 and Tr10).

After the data have fully been transferred to the signal lines CLi and /CLi, the transfer signal CT2$a$ is rendered high in level. Thus, the transfer transistors Tri1$a$ and Tri2$a$ of the transfer circuit Ha are turned on to electrically connect the signal lines CLi and /CLi to their corresponding bit lines BLi$a$ and /BLi$a$. Accordingly, the data on the signal lines CLi and /CLi are temporarily transferred to the bit lines BLi$a$ and /BLi$a$. The transferred data are respectively amplified by the sense amplifiers SAi$a$ and thereafter stored in their corresponding capacitors Ci1$a$ of the memory cells (corresponding to the memory cells whose memory cell transistors CTri1$a$ are kept on) connected to the word line WL2$a$.

Incidentally, while only the read operation has been described in the second embodiment, a write operation can easily be understood if a reference is made to the write operation of the first embodiment and the read operation of the second embodiment.

Since the read and write registers are respectively configured in half number in the second embodiment as described above as compared with the first embodiment, a reduction in chip size, restraint on an increase in the number of peripheral circuits, and low power consumption can be achieved as compared with the first embodiment.

Figure 5A:
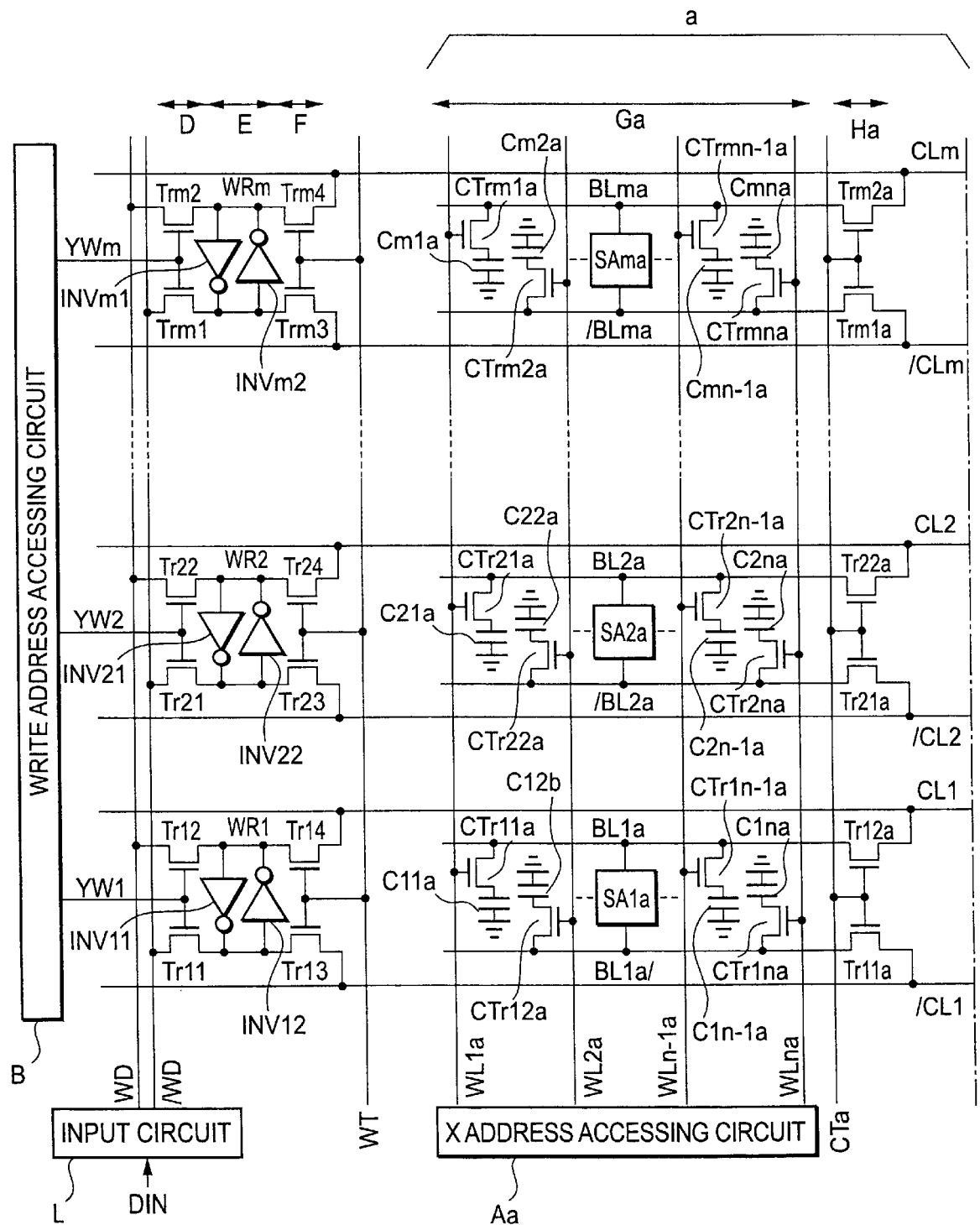
FIG. 5 is a simplified circuit diagram depicting a circuit of a principal part of a serial access memory according to a third embodiment of the present invention.
Figure 5B:
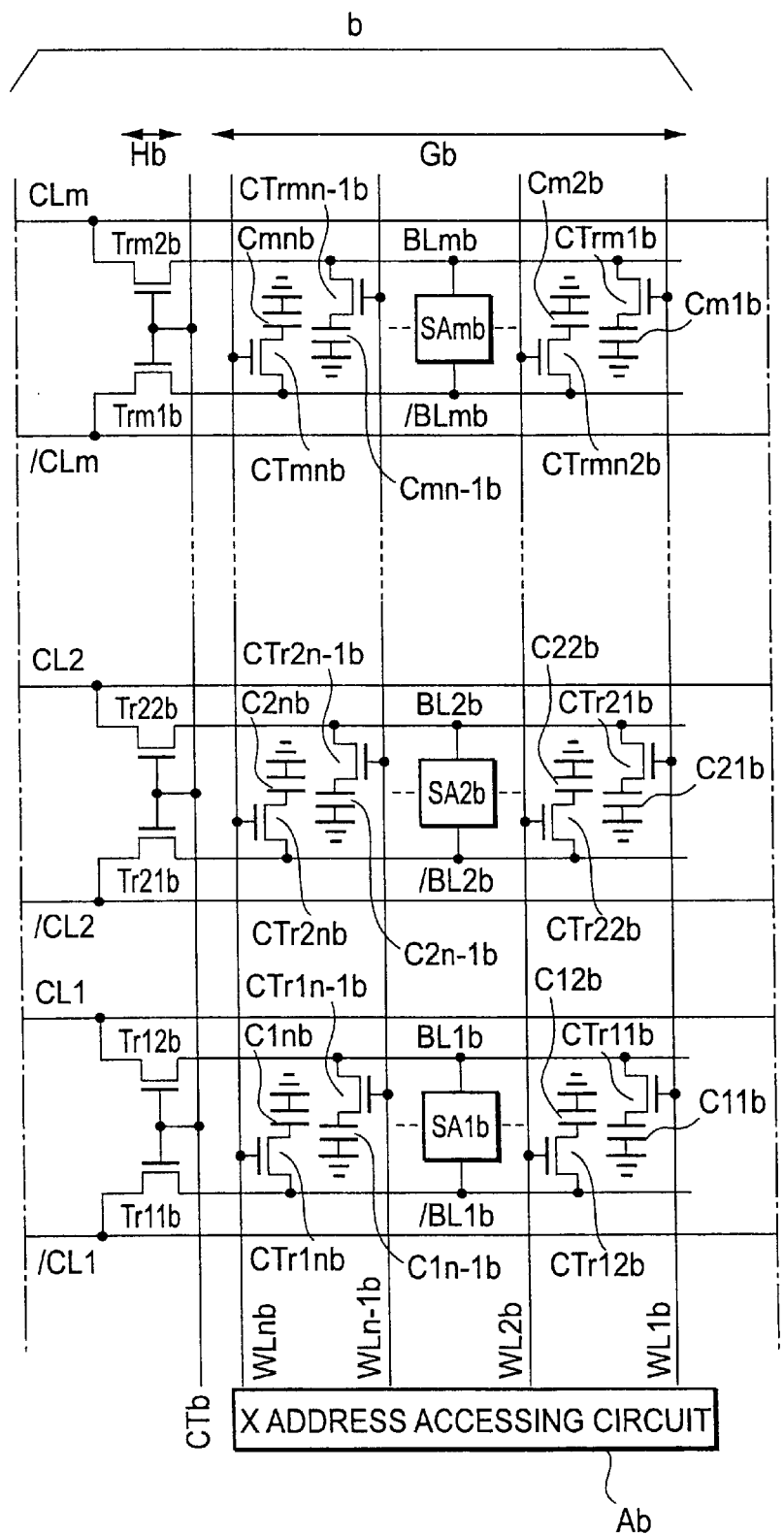
Figure 5C:
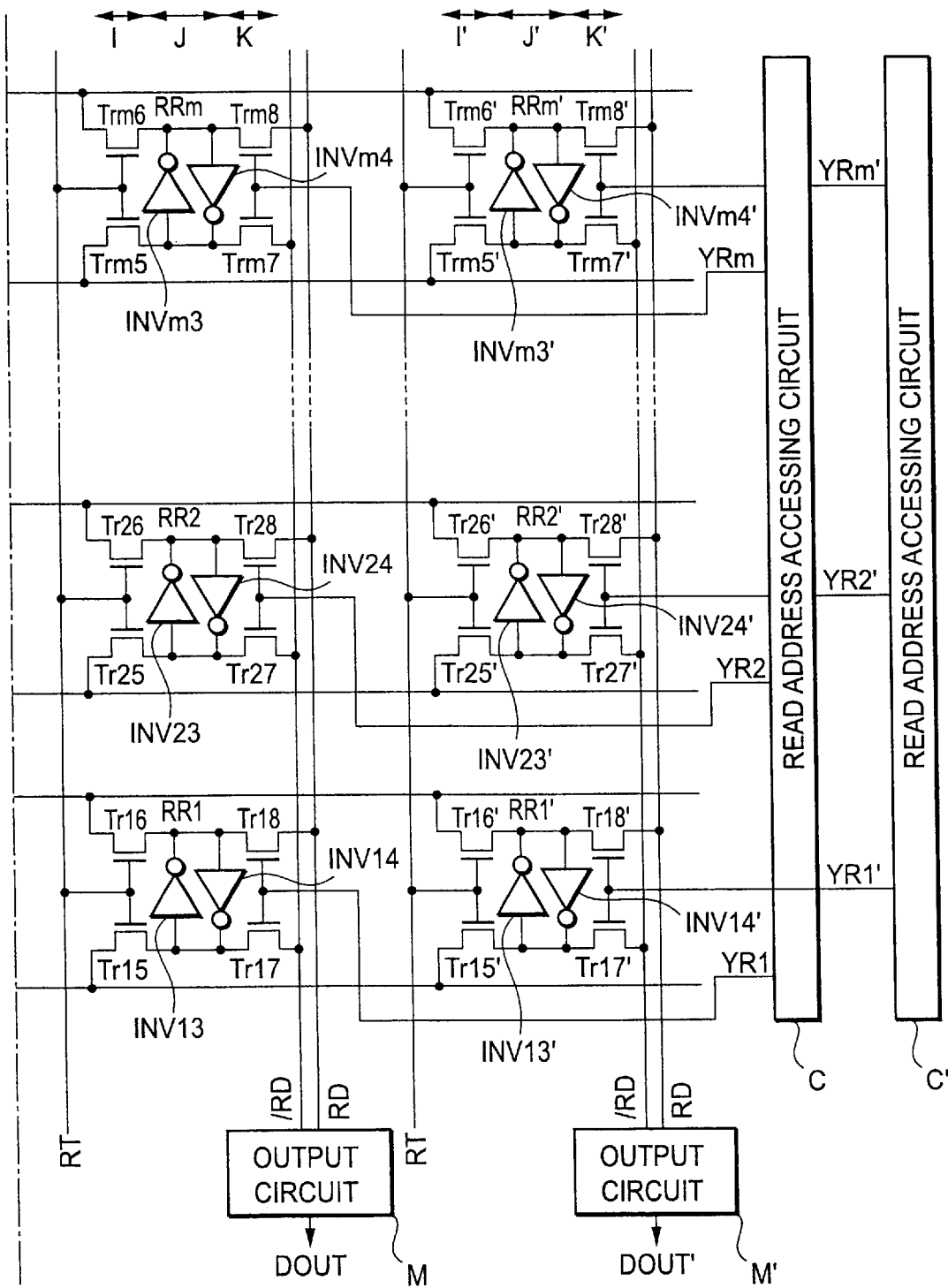

FIG. 5 is a simplified circuit diagram showing a circuit of a principal part of a serial access memory according to a third embodiment of the present invention. In FIG. 5, the same portions as those shown in FIG. 1 are identified by the same reference numerals and the description thereof will therefore be omitted. A configuration of the third embodiment will be explained below with reference to FIG. 5.

The serial access memory according to the third embodiment is one wherein one read register (one set) is additionally provided to set the read port of the first embodiment to two. Namely, the configuration of the serial access memory according to the third embodiment is one obtained by adding the following configuration to the first embodiment.

Added read registers RRi' are respectively electrically connected to first ends of signal lines CLi and /CLi through an added transfer circuit I' on the connection side of read registers RRi through a transfer circuit I. The added read registers RRi' respectively comprise two inverters whose input and output are connected to each other, in a manner similar to the read registers RRi. Further, the added transfer circuit I' also comprises added transistor pairs Tri5' and Tri6' in a manner similar to the transfer circuit I. The added transfer transistors Tri5' or Tri6' have first terminals respectively electrically connected to the added read registers RRi', second terminals respectively electrically connected to the signal lines CLi and /CLi, and gates respectively commonly supplied with a read transfer signal RT'.

Further, the added read registers RRi' are also electrically connected to added read data buses RD' and /RD' through a transfer circuit K'. The transfer circuit K' comprises added transfer transistor pairs Tri7' and Tri8'. First terminals of the added transfer transistors Tri7' and Tri8' are respectively electrically connected to the added read registers RRi', second terminals thereof are respectively electrically connected to the added read data buses RD' and /RD', and their gates are respectively commonly supplied with added address signals YRm'. The added address signals YRm' are generated by an added read address accessing circuit C'. The added read address accessing circuit C' activates only one added address signal YRm' in response to an unillustrated address signal. Thus, only data stored in the added read registers RRi' connected to the added transfer transistor pairs Tri7' and Tri8' supplied with the activated added address signal YRm' are read into the added read data buses RD' and /RD'.

An added output circuit M' is electrically connected to the added read data buses RD' and /RD'. The added output circuit M' outputs the data outputted to the added read data buses RD' and /RD' to the outside as added output data DOUT'.

Figure 6:
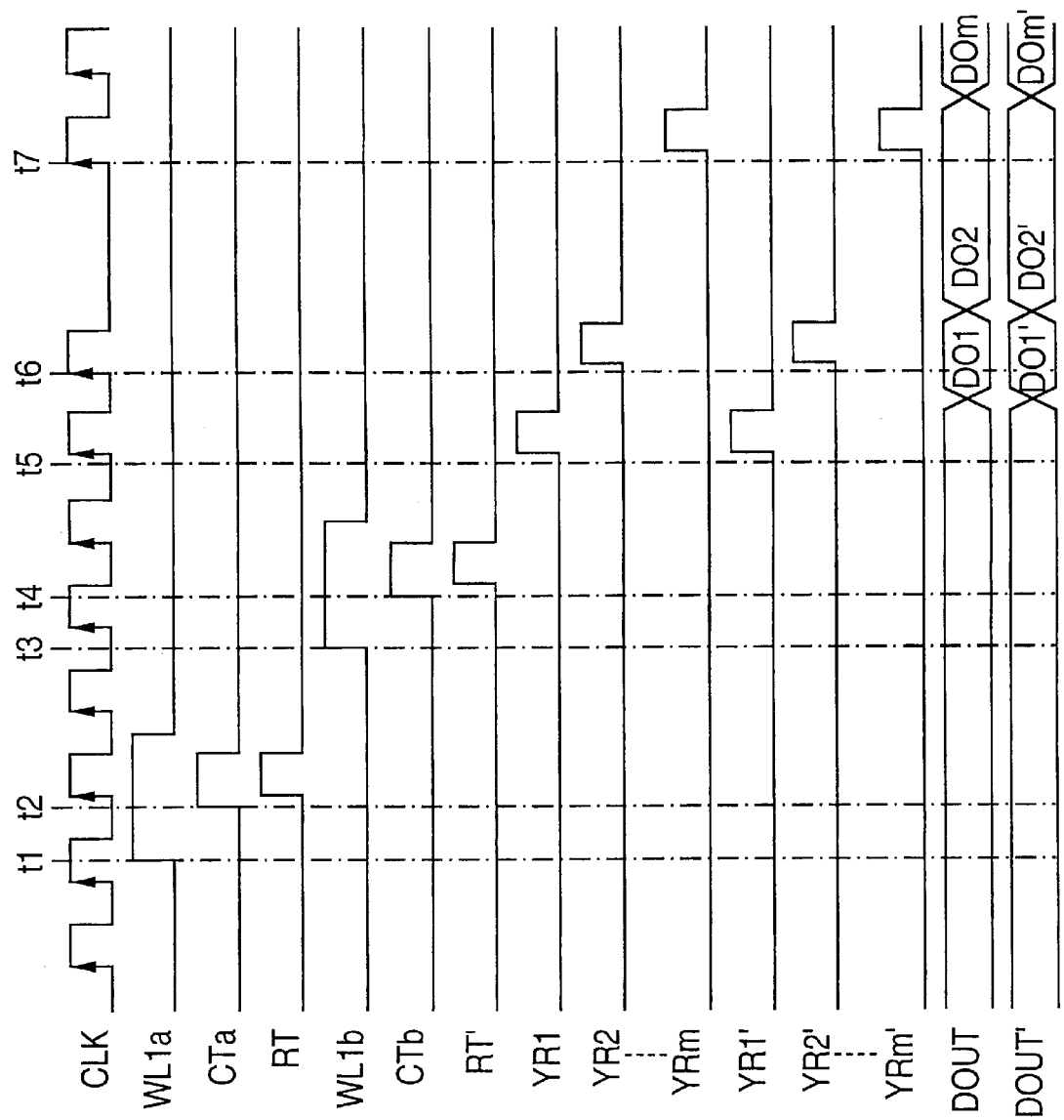
FIG. 6 is a timing chart for describing operating timings for the serial access memory according to the third embodiment of the present invention.

The operation of the serial access memory according to the third embodiment will next be described with reference to FIG. 6. Since the serial access memory according to the third embodiment is similar in write operation to the first embodiment, the description thereof will be omitted and only a read operation thereof will be explained.
<Time t1>
An X address accessing circuit Aa selects the corresponding word line WL1a (which is tentatively set as WL1a for explanation herein) and supplies a high level signal to the word line WL1a. Thus, memory cell transistors CTri1a of memory cells connected to the word line WL1a are turned on to transfer data stored in capacitors Ci1a of the memory cells to their corresponding bit lines pairs BLia and /BLia. Sense amplifiers SAia respectively amplify the data on the bit line pairs BLia and /BLia.
<Time t2>
Since a transfer signal CTa is rendered high in level, transfer transistors Tri1a and Tri2a of a transfer circuit Ha are turned on so that the signal lines CLi and /CLi are electrically connected to their corresponding bit line pairs BLia and /BLia. Thus, the data on the bit line pairs BLia and /BLia, which have been amplified by the sense amplifiers SAia, are temporarily transferred onto the signal lines CLi and /CLi through the transfer transistors Tri1a and Tri2a.

Afterwards, a read transfer signal RT is rendered high in level. Thus, transfer transistors Tri5 and Tri6 of the transfer circuit I are turned on to electrically connect the signal lines CLi and /CLi to their corresponding read registers RRi. Accordingly, the data on the signal lines CLi and /CLi are respectively written into the read registers RRi. This is called a so-called read transfer operation.
<Time t3>
An X address accessing unit Ab selects the corresponding word line WL1b (which is tentatively set as WL1b for explanation herein) and supplies a high level signal to the word line WL1b. Thus, memory cell transistors CTri1b of memory cells connected to the word line WL1b are turned on so that data stored in capacitors Ci1b of the memory cells are transferred to their corresponding bit lines pairs BLib and /BLib. Sense amplifiers SAib respectively amplify the data on the bit line pairs BLib and /BLib.
<Time t4>
Since a transfer signal CTb is rendered high in level, transfer transistors Tri1b and Tri2b of a transfer circuit Hb are turned on to electrically connect the signal lines CLi and /CLi to their corresponding bit lines BLib and /BLib. Thus, the data on the bit line pairs BLib and /BLib, which have been amplified by the sense amplifiers SAib, are temporarily transferred onto the signal lines CLi and /CLi through the transfer transistors Tri1b and Tri2b.

Afterwards, the added read transfer signal RT' is rendered high in level. Thus, the added transfer transistors Tri5' and Tri6' of the added transfer circuit I' are turned on so that the signal lines CLi and /CLi are electrically connected to their corresponding added read registers RRi'. Accordingly, the data on the signal lines CLi and /CLi are respectively written into the added read registers RRi'. Namely, this is called an added read transfer operation.
<Time t5>
Data transferred from a memory cell or memory block a to its corresponding read register J are temporarily stored in the read register J according to the read transfer operation. Data transferred from a memory cell or memory block b to its corresponding added read register J' are temporarily stored in the added read register J'. Thereafter, an address YR1 of outputs produced from a read address accessing circuit C is brought to a high level, and an address YR1' of outputs produced from the added read address accessing circuit C' is rendered high in level. Thus, transfer transistors Tr17 and Tr18 are turned on so that the data stored in the read register RR1 is transferred to the corresponding read data buses RD and /RD. Further, added transfer transistors Tr17' and Tr18' are turned on so that the data stored in the added read register RR1' is transferred to the corresponding added read data buses RD' and /RD'. The transferred data are transferred to their corresponding output circuits M and added output circuits M' from which they are outputted as data DO1 and added data DO1' of output data DOUT and added output data DOUT'.
<Time t6>
An address YR2 of the outputs produced from the read address accessing circuit C is brought to a high level, and an address YR2' of the outputs produced from the added read address accessing circuit C' is rendered high in level. Thus, the transfer transistors Tr17 and Tr18 are turned on so that the data stored in the read register RR2 is transferred to the read data buses RD and /RD. Further, the added transfer transistors Tr17' and Tr18' are turned on so that the data stored in the added read register RR2' is transferred to the corresponding added read data buses RD' and /RD'. The transferred data are transferred to their corresponding output circuits M and added output circuits M' from which they are outputted as data DO2 and added data DO2' of the output data DOUT and added output data DOUT'.

<Time t7>

An address YRm of the outputs produced from the read address accessing circuit C is brought to a high level, and an address YRm' of the outputs produced from the read address accessing circuit C' is rendered high in level. Thus, the transfer transistors Tr17 and Tr18 are turned on so that the data stored in the read register RRm is transferred to the read data buses RD and /RD. Further, the added transfer transistors Tr17' and Tr18' are turned on so that the data stored in the added read register RRm' is transferred to the corresponding added read data buses RD' and /RD'. The transferred data are transferred to their corresponding output circuit M and added output circuit M' from which they are outputted as data DOm and added data DOm' of the output data DOUT and added output data DOUT'.

The serial access memory according to the third embodiment is disadvantageous over the first embodiment in both chip size and current consumption because the added read registers are additionally provided as compared with the first embodiment. However, the serial access memory has the advantage of being capable of simultaneously obtaining outputs from the two output circuits as is understood from FIG. 6.

Figure 7A:
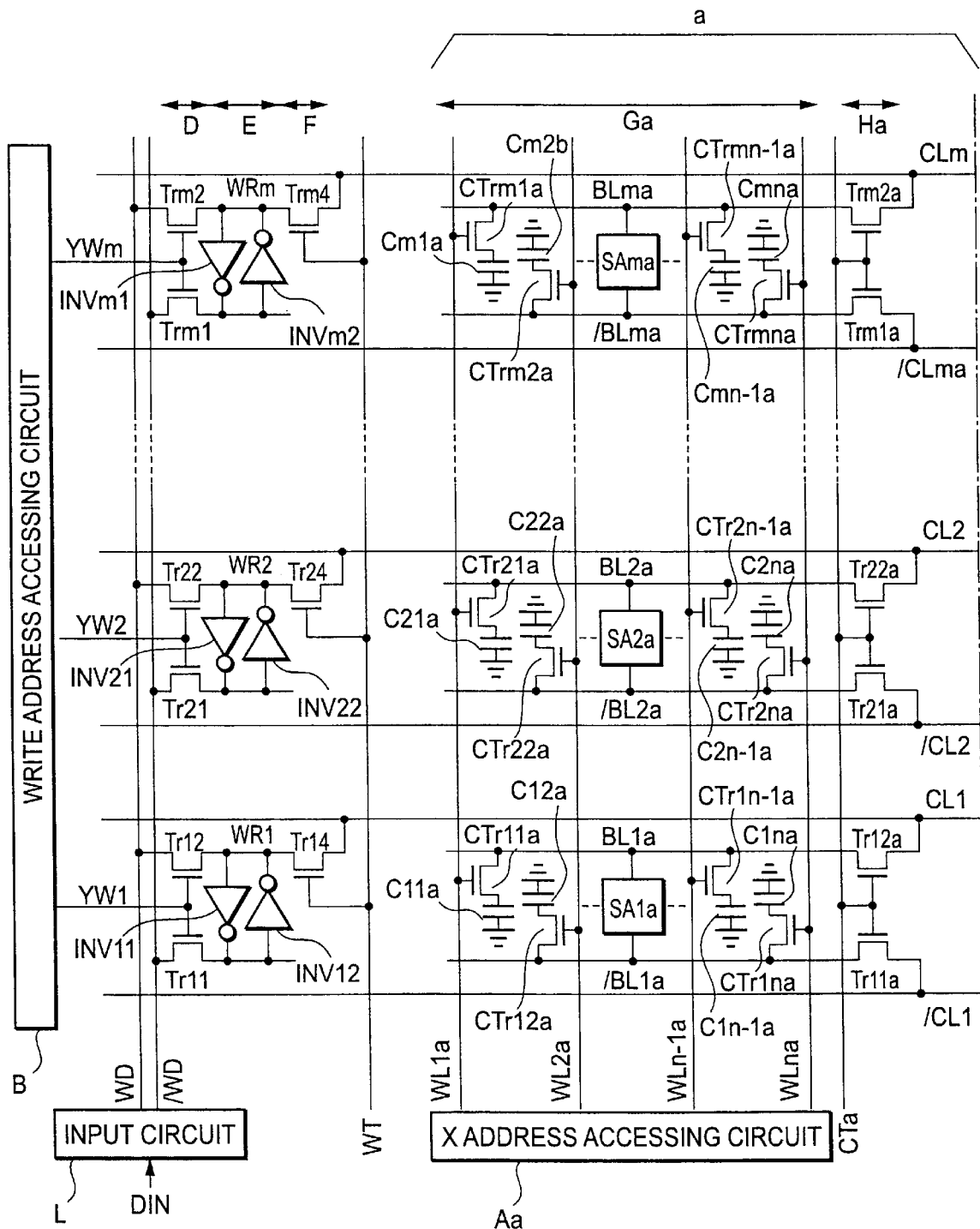
FIG. 7 is a simplified circuit diagram showing a circuit of a principal part of a serial access memory according to a fourth embodiment of the present invention.
Figure 7B:
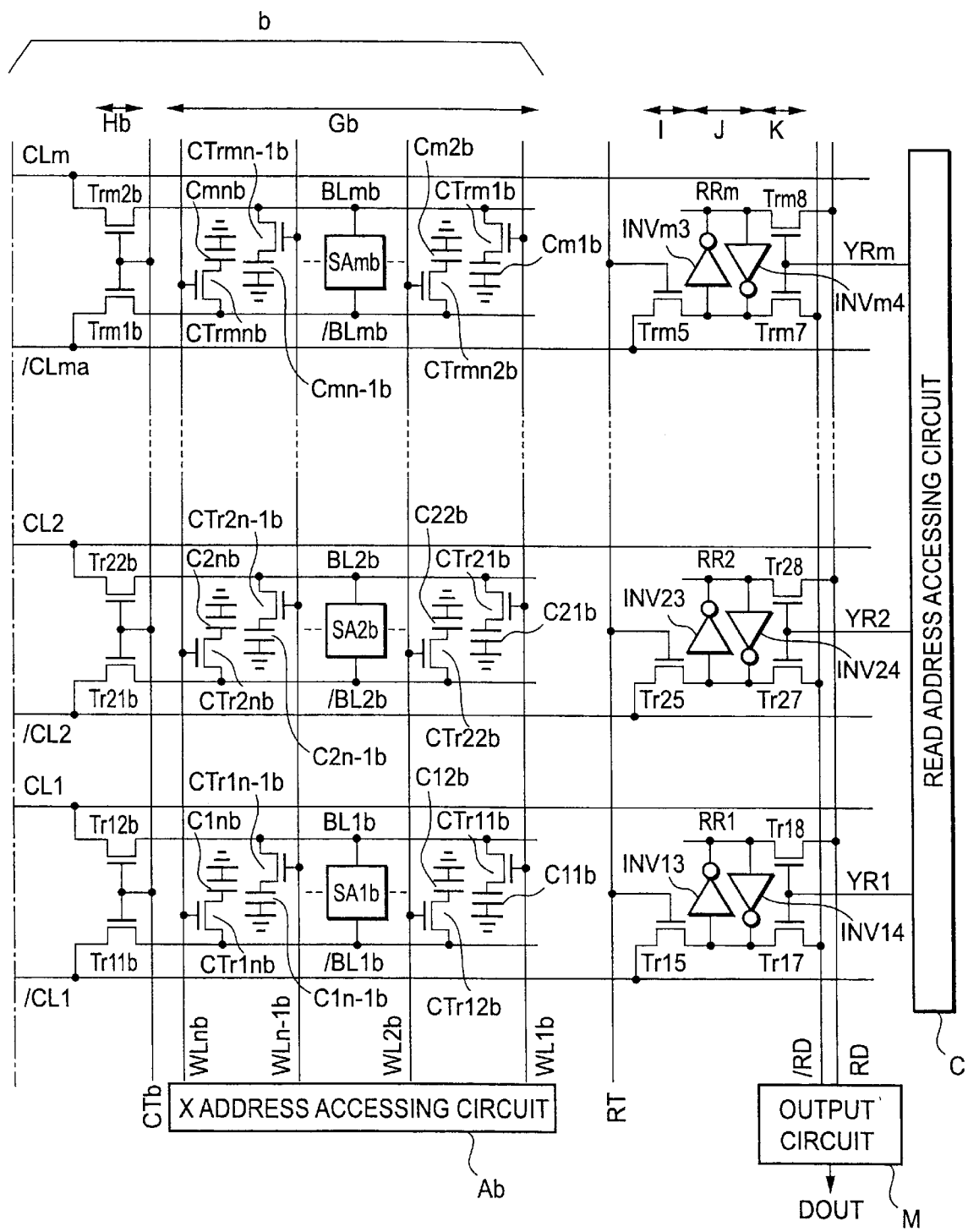

FIG. 7 is a simplified circuit diagram showing a circuit of a principal part of a serial access memory according to a fourth embodiment of the present invention. In FIG. 7, the same portions as those shown in FIG. 1 are identified by the same reference numerals and their description will be omitted. A configuration of the fourth embodiment will be explained below with reference to FIG. 7.

The serial access memory according to the fourth embodiment is equivalent to one wherein the transfer circuits F and I employed in the first embodiment are respectively made up of only one transistor. Namely, in the fourth embodiment, the transfer circuits F and I respectively connect a write register E and a read register J to only either of signal lines CLi and /CLi.

Only points different from the first embodiment will be explained in the fourth embodiment. The transfer circuits F and I comprise respective one transistors Tri4 and Tri5 respectively. Transfer transistors Tri4 have first terminals electrically connected to their corresponding write registers WRi, second terminals electrically connected to their corresponding signal lines CLi (which may be /CLi although CLi have been used in the present embodiment), and gates each supplied with a write transfer signal WT. Further, the transfer transistors Tri5 have first terminals electrically connected to their corresponding read registers RRi, second terminals electrically connected to their corresponding signal lines CLi (which may be /CLi although the CLi have been used in the present embodiment), and gates each supplied with a read transfer signal RT.

The serial access memory according to the fourth embodiment has the possibility that it will become advantageous over the first embodiment in chip size because the number of transistors is low as compared with the first embodiment. However, no data is supplied to the signal lines disconnected from the transfer circuits F and I. Accordingly, the serial access memory has the potential for an increase in the load on each sense amplifier and the need for much time.

Figure 8A:
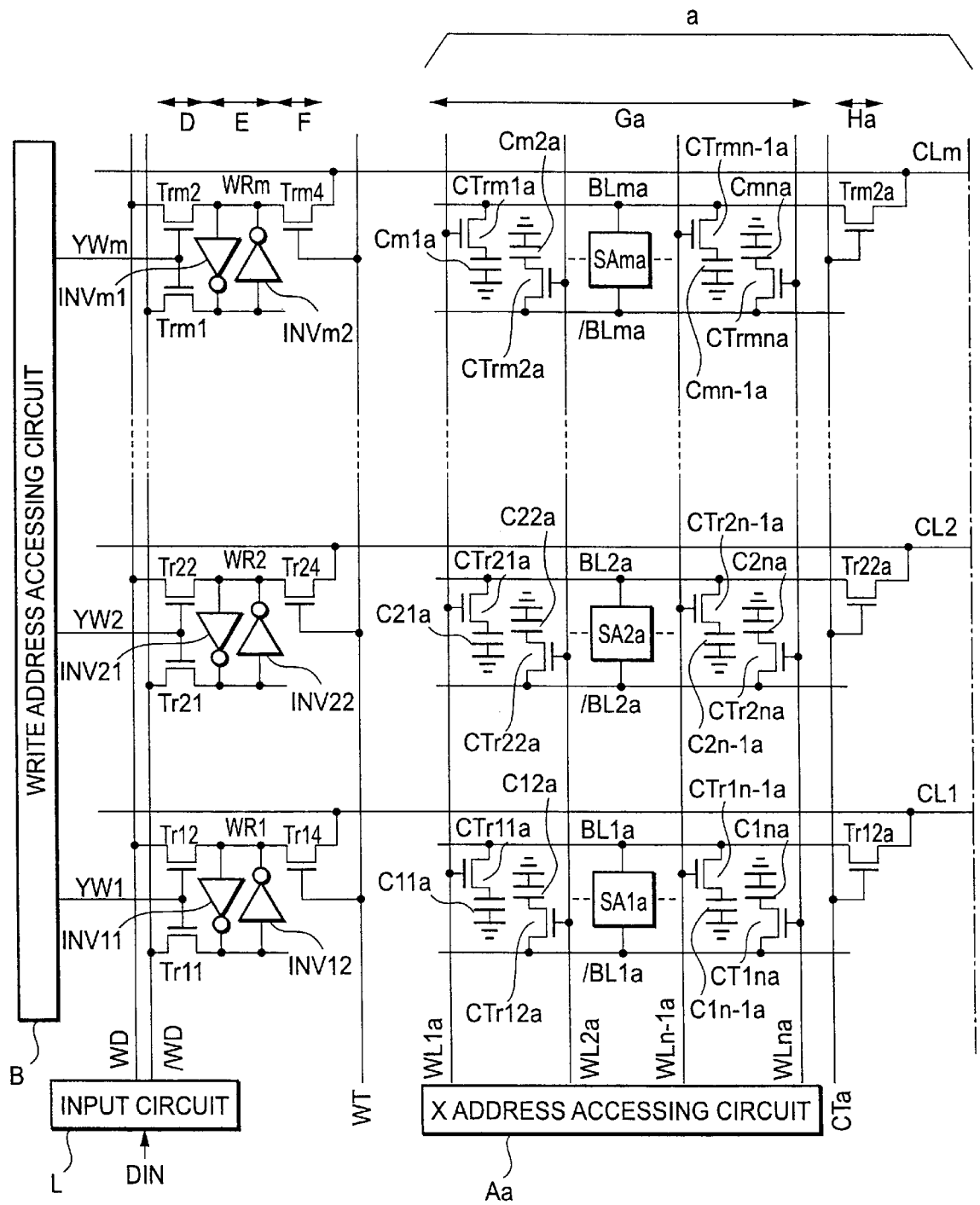
FIG. 8 is a simplified circuit diagram illustrating a circuit of a principal part of a serial access memory according to a fifth embodiment of the present invention.
Figure 8B:
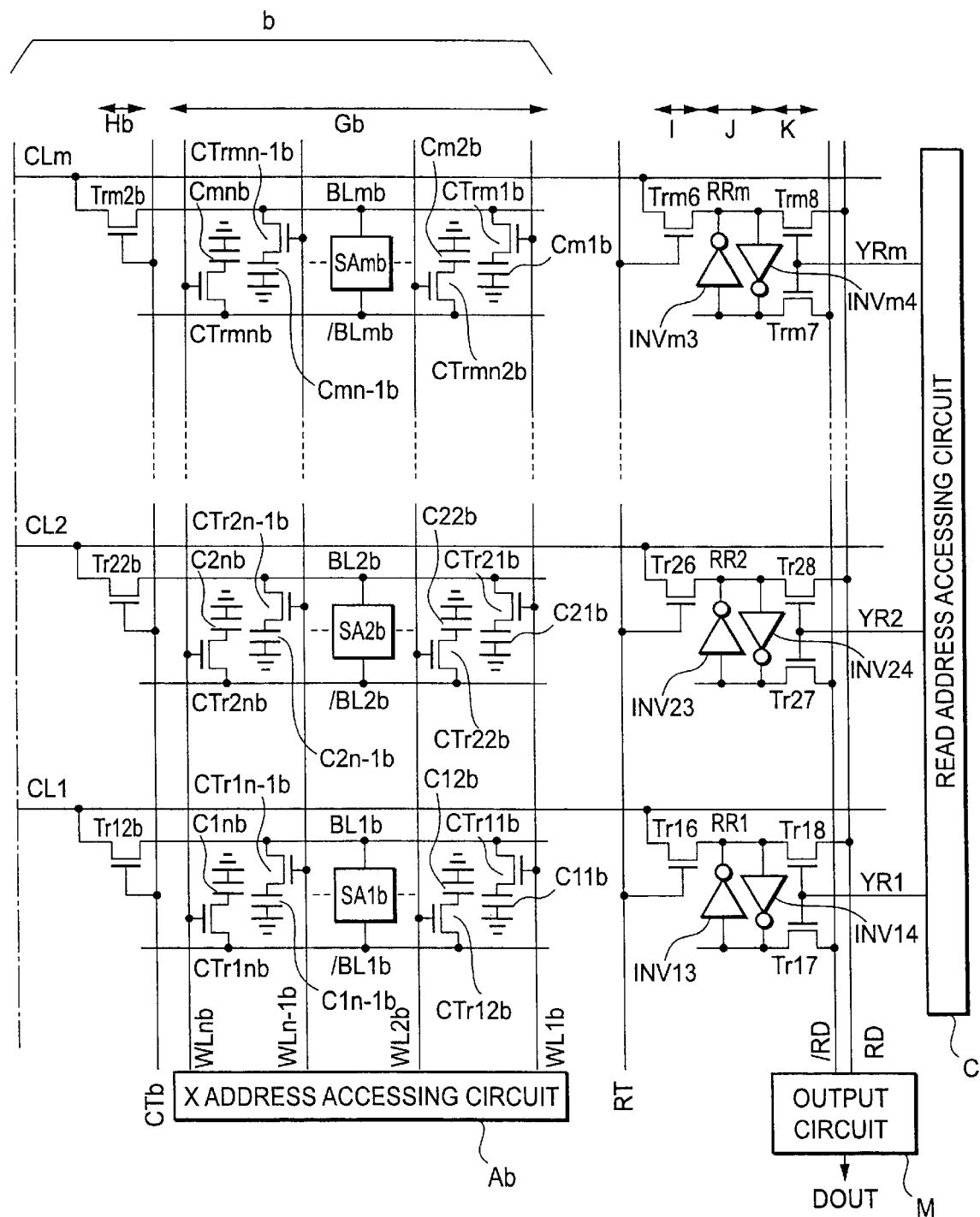

FIG. 8 is a simplified circuit diagram showing a circuit of a principal part of a serial access memory according to a fifth embodiment of the present invention. In FIG. 8, the same portions as those shown in FIG. 7 are identified by like reference numerals and their description will be omitted. A configuration of the fifth embodiment will be explained below with reference to FIG. 8.

The serial access memory according to the fifth embodiment is equivalent to one wherein the transfer circuits Ha and Hb employed in the fourth embodiment are respectively made up of only one transistor, and the number of signal lines is set to one alone without being set in pairs. Namely, in the fifth embodiment, the transfer circuits Ha and Hb respectively connect bit line pairs BLia or /BLia or BLib or /BLib to signal lines CLi.

Only points different from the fourth embodiment will be explained in the fifth embodiment. The transfer circuits Ha and Hb comprise respective one transistors Tri2a and Tri2b respectively. The transfer transistors Tri2a have first terminals electrically connected to their corresponding bit line pairs BLia (which may be /BLia although BLia have been used in the present embodiment), second terminals electrically connected to their corresponding signal lines CLi, and gates each supplied with a write transfer signal WT. Further, the transfer transistors Tri2b have first terminals electrically connected to their corresponding bit line pairs BLib (which may be /BLib although BLib have been used in the present embodiment), second terminals electrically connected to their corresponding signal lines CLi, and gates each supplied with a read transfer signal RT.

The serial access memory according to the fifth embodiment is advantageous over the fourth embodiment in chip size because the number of transistors and the number of signal lines are low as compared with the fourth embodiment. However, no data is supplied to the bit lines disconnected from the transfer circuits Ha and Hb. Accordingly, the serial access memory has the potential for an increase in the load on each sense amplifier and the need for much time.

Figure 9A:
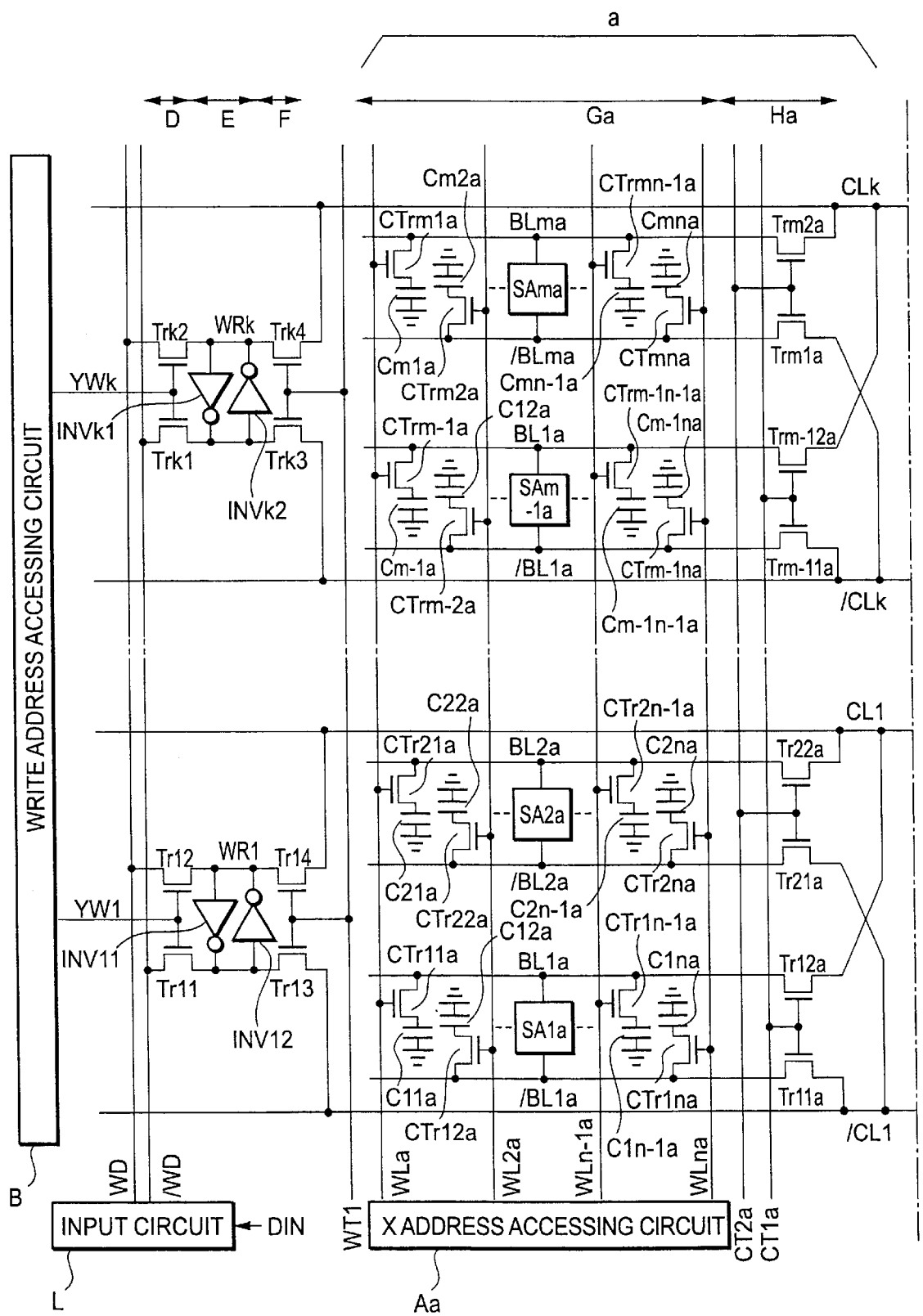
FIG. 9 is a simplified circuit diagram depicting a circuit of a principal part of a serial access memory according to a sixth embodiment of the present invention.
Figure 9B:
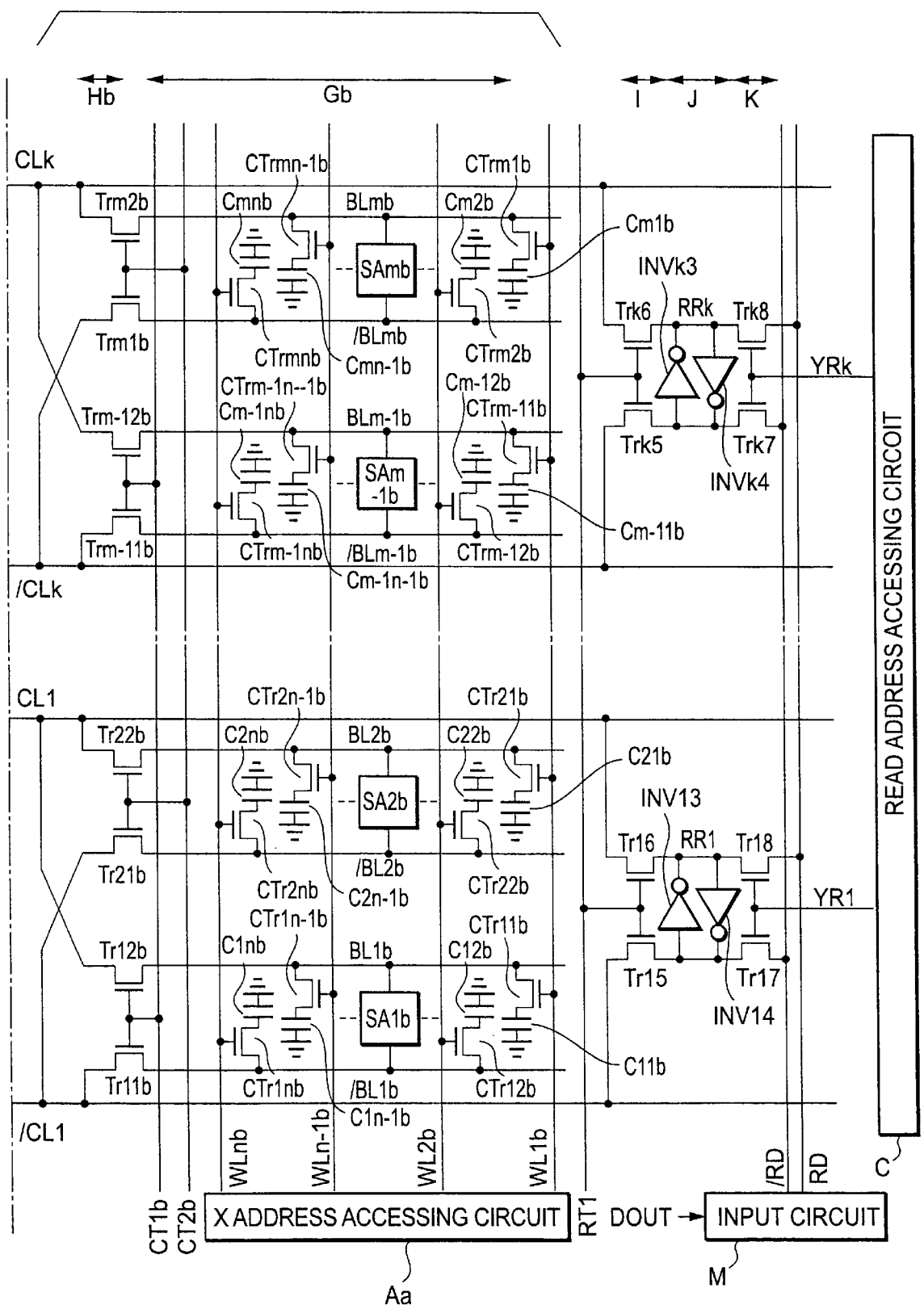

FIG. 9 is a simplified circuit diagram showing a circuit of a principal part of a serial access memory according to a sixth embodiment of the present invention. In FIG. 9, the same portions as those shown in FIG. 3 are identified by the same reference numerals and their description will be omitted. A configuration of the sixth embodiment will be explained below with reference to FIG. 9.

The serial access memory according to the sixth embodiment has a configuration wherein one pair of the signal line pairs CLi and /CLi is provided for the two pairs of the bit line pairs BLia and /BLia, or the two pairs of the bit line pairs BLib and /BLib in the second embodiment. Therefore, transfer circuits F and I are simply provided in association with the signal line pairs CLi and /CLi, and one control signal is used therefor in a manner similar to the first embodiment. Transfer circuits Ha and Hb are respectively connected to one pair of the signal line pairs CLi and /CLi common to the two pairs of the bit line pairs BLia and /BLia or BLib and /BLib.

Only points different from the second embodiment will be explained in the sixth embodiment.

The bit line pairs BLia and /BLIa or BLib and /BLib set in column units are electrically connected to their corresponding pairs of signal lines CLk and /CLk parallel to the bit line pairs BLia, /BLia, BLib or /BLib and common to memory blocks a and b through the transfer circuits Ha and Hb. Here, the signal line pairs CLk and /CLk are provided commonly to the two pairs (e.g., BL1a and /BL1a and BL2a and /BL2a, or BL1b and /BL1b and BL2b and /BL2b) of the bit line pairs.

The transfer circuits Ha or Hb comprises transfer transistor pairs Tri1a and Tri2a or Tri1b and Tri2b. The odd-numbered transfer transistor (e.g.,Tri11a, Tr12a, Tr11b or Tri12b) has a first terminal electrically connected to its corresponding bit line (e.g., BL1a, [bL1a/] /BL1a, BL1b or /BL1b), a second terminal electrically connected to its corresponding signal line (e.g., CL1, /CL1) and a gate commonly supplied with a fist transfer signal CT1a or CT1b. On the other hand, the even-numbered transfer transistor (e.g., Tr21a, Tr22a, Tr21b or Tr22b) has a first terminal electrically connected to its corresponding bit line (e.g., BL2a, /BL2a, /BL2b), a second terminal electrically connected to its corresponding signal line (e.g., CL1, /CL1) common to the odd-numbered one, and a gate commonly supplied with a second transfer signal CT2a or CT2b.

Read and write registers RRk and WRk are electrically connected to their corresponding both ends of the signal lines CLk and /CLk through the transfer circuits I and F. The transfer circuits F and I respectively comprise transistor pairs Trk3 and Trk4 or Trk5 and Trk6. The transfer transistor Trk3 or Trk4 has a first terminal electrically connected to its corresponding write register WRk, a second terminal electrically connected to its corresponding signal line CLk or /CLk and a gate commonly supplied with a write transfer signal WT. Further, the transfer transistor Trk5 or Trk6 has a first terminal electrically connected to its corresponding read register RRk, a second terminal electrically connected to its corresponding signal line CLk or /CLk and a gate commonly supplied with a read transfer signal RT.

The serial access memory according to the sixth embodiment can be reduced in chip size as compared with the second embodiment because the number of the signal line pairs and the number of the transfer circuits for connecting the signal line pairs and the read and write registers are low as compared with the second embodiment.

Figure 10A:
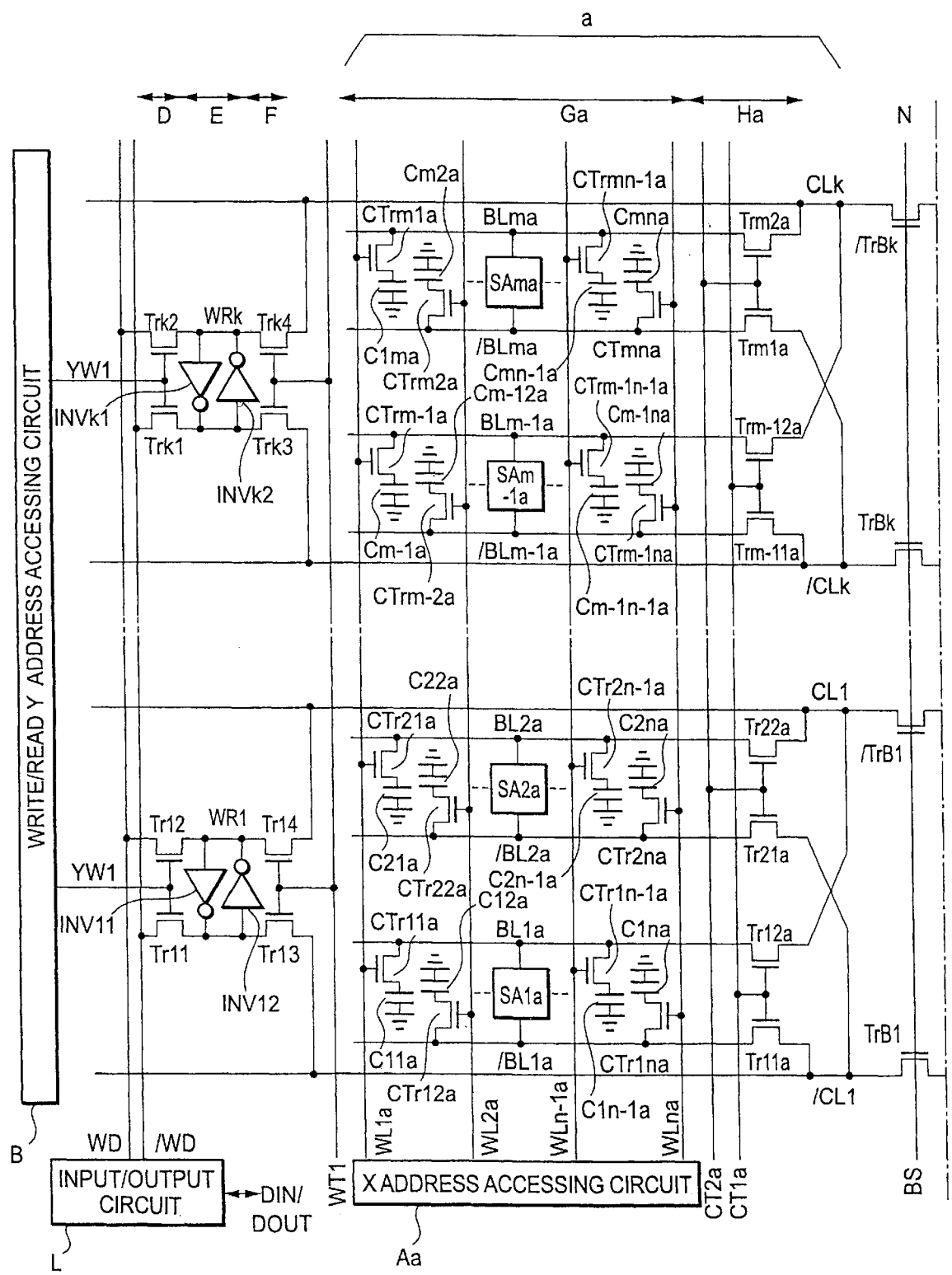
FIG. 10 is a simplified circuit diagram showing a circuit of a principal part of a serial access memory according to a seventh embodiment of the present invention.
Figure 10B:
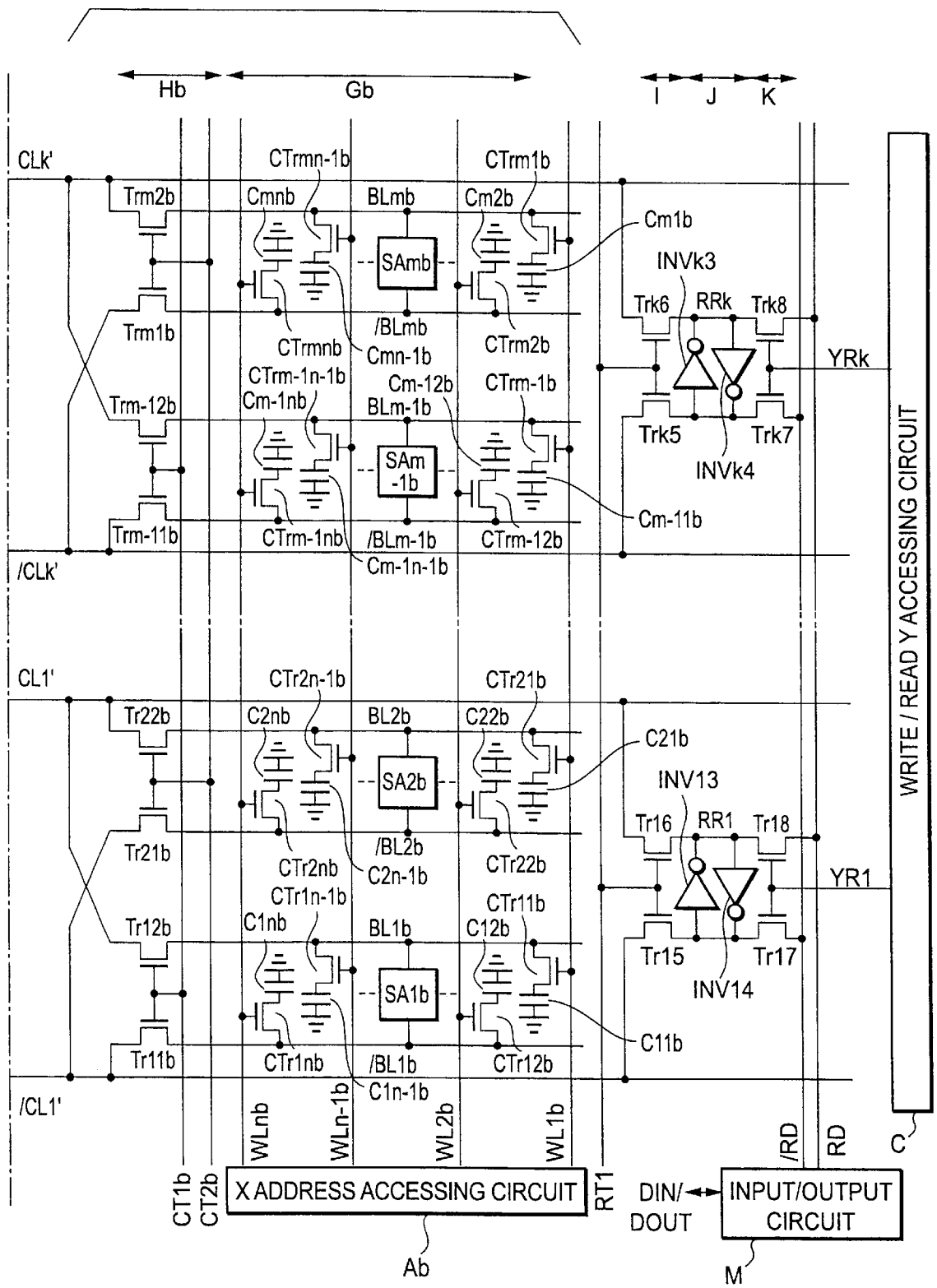

FIG. 10 is a simplified circuit diagram showing a circuit of a principal part of a serial access memory according to a seventh embodiment of the present invention. In FIG. 10, the same portions as those shown in FIG. 9 are identified by the same reference numerals and their description will be omitted. A configuration of the seventh embodiment will be explained below with reference to FIG. 10.

The serial access memory according to the seventh embodiment is provided with a dividing circuit N for separating the memory block a and the memory block b employed in the sixth embodiment from each other.

Only points different from the sixth embodiment will be explained in the seventh embodiment.

Signal line pairs common to memory blocks a and b employed in the seventh embodiment are divided into signal line pairs CLk and /CLk for the memory block a and signal line pairs CLk' and /CLk' for the memory block b. The dividing circuit N controls connections or non-connections between the divided signal line pairs. The dividing circuit N comprises dividing transistor pairs TrBk and /TrBk. The dividing transistors TrBk respectively have first terminals electrically connected to their corresponding signal line pairs CLk, second terminals electrically connected to their corresponding signal line pairs CLk' and gates supplied with a division signal BS. On the other hand, the dividing transistors /TrBk respectively have first terminals electrically connected to their corresponding signal lines pairs /CLk, second terminals electrically connected to their corresponding signal lines pairs /CLk' and gates supplied with the division signal BS. The serial access memory according to the seventh embodiment is disadvantageous over the sixth embodiment in a reduction in chip size because the dividing circuit is additionally provided. However, the serial access memory according to the seventh embodiment has the operational merit of being capable of separating the memory block a and the memory block b by the dividing circuit to thereby execute a read transfer and a write transfer simultaneously.

Figure 11A:
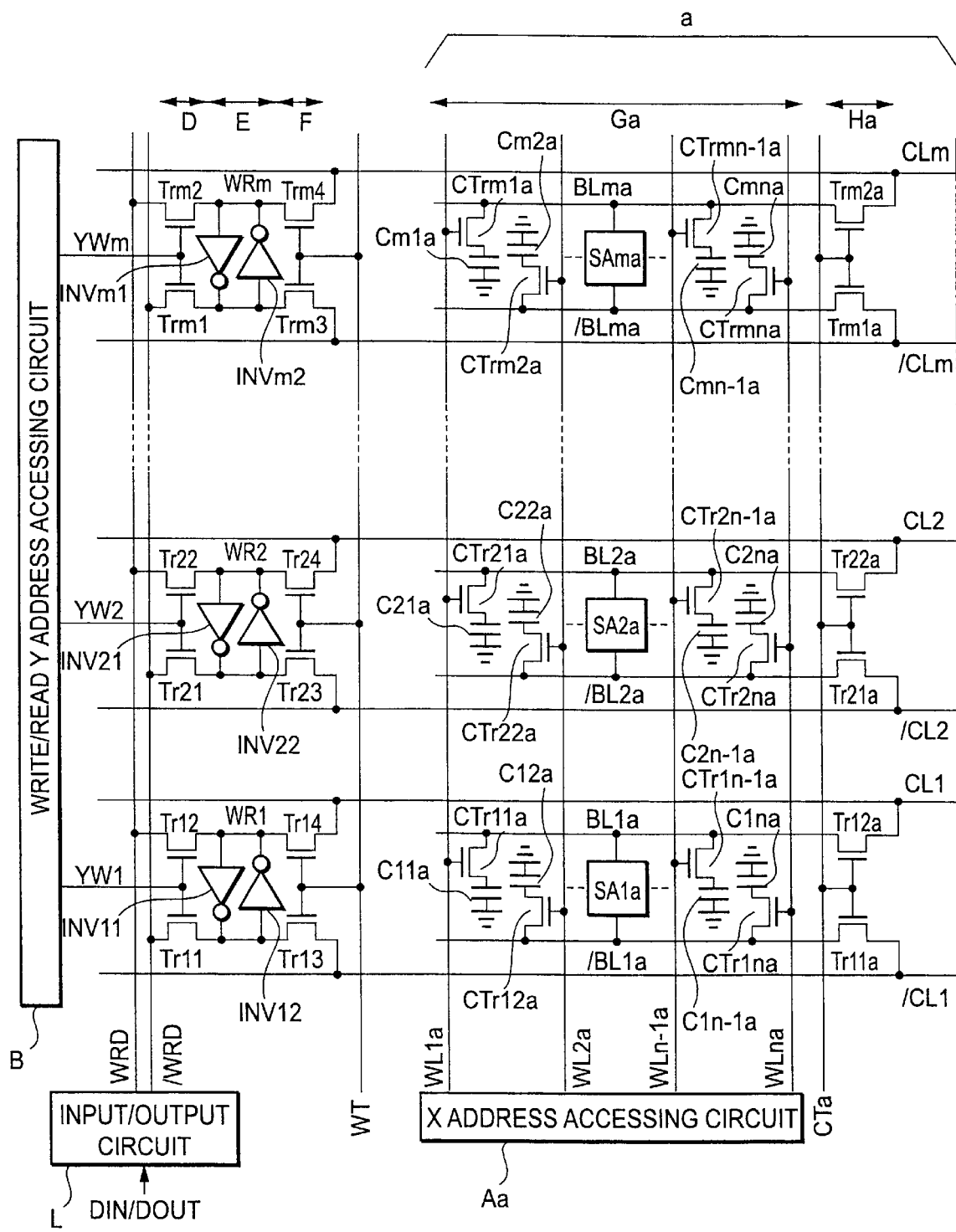
FIG. 11 is a simplified circuit diagram illustrating a circuit of a principal part of a serial access memory according to an eighth embodiment of the present invention.
Figure 11B:
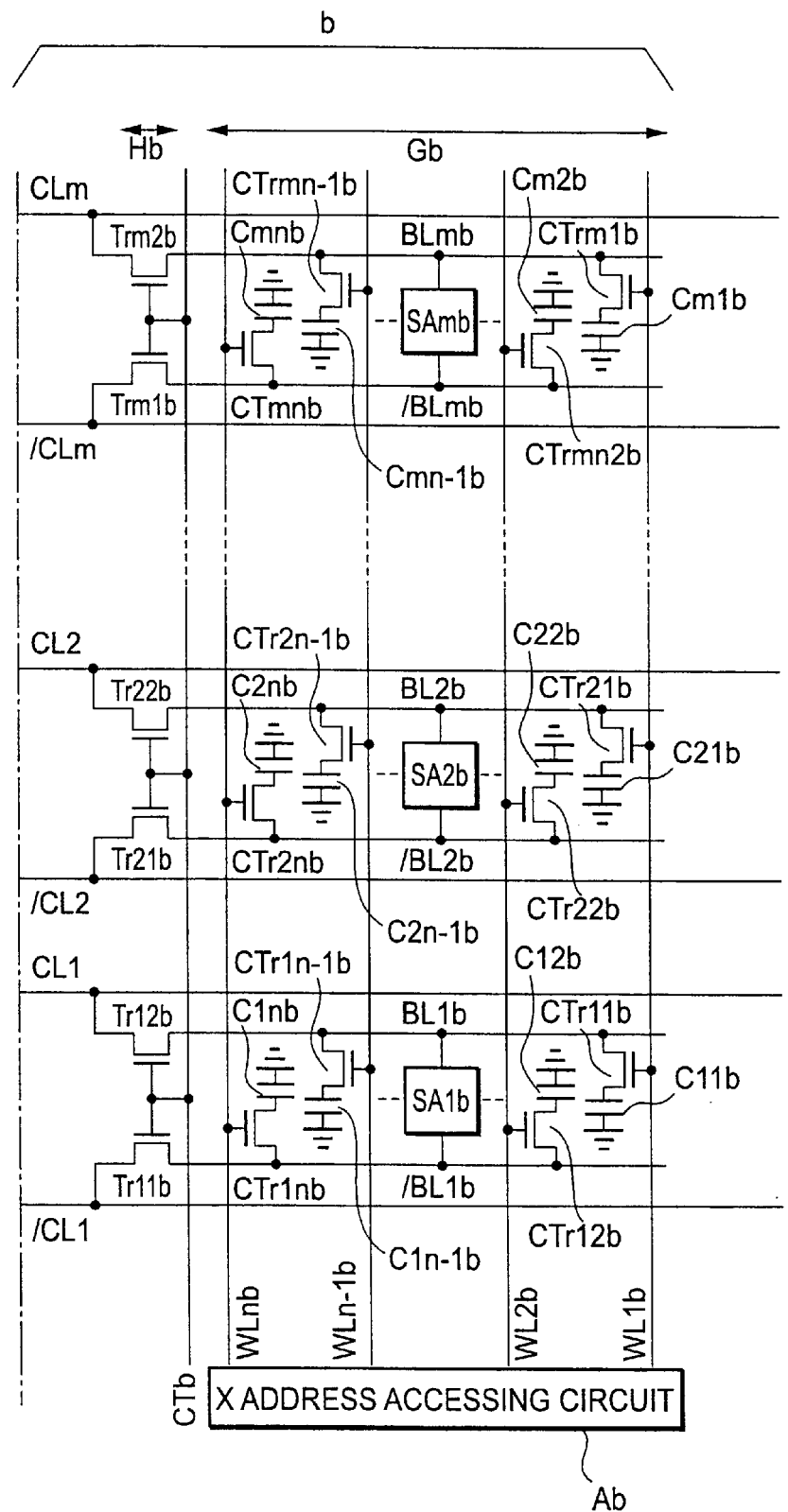

FIG. 11 is a simplified circuit diagram showing a circuit of a principal part of a serial access memory according to an eighth embodiment of the present invention. A configuration of the eighth embodiment will be explained below with reference to FIG. 11. In FIG. 11, the same portions as those shown in FIG. 1 are identified by the same reference numerals and their description will be omitted.

The serial access memory according to the present embodiment uses registers as read/write registers held in common or shared for write/read without exclusively using the registers as in the case of the read register and the write register. Thus, as is understood from a comparison made between FIG. 1 and FIG. 11, the serial access memory according to the eighth embodiment has a configuration in which the read registers of the serial access memory according to the first embodiment are omitted.

Only points different from the first embodiment will be explained in the eighth embodiment. Only write/read registers WRm electrically connected to their corresponding one ends of signal line pairs CLi and /CLi are used as registers employed in the eighth embodiment. Thus, data buses are configured as input/output data buses WRD and /WRD, and an input/output circuit L' handles input data DIN and output data DOUT.

In the serial access memory according to the eighth embodiment, a reduction in chip size can be achieved because the read registers (or write registers), transfer circuits related thereto, buses and output circuits (or input circuits) can be omitted as compared with the first embodiment. Since, however, the registers are held in write/read common use in the serial access memory according to the eighth embodiment, the serial access memory has the demerit of being unable to asynchronously simultaneously perform a write operation and a read operation.

According to the invention of the present application as described above in detail, a serial access memory low in current consumption can be provided which is capable of restraining an increase in chip size even if memory capacity increases.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A serial access memory comprising:
    a first memory array including a first memory cell and a pair of first bit lines, said first memory cell being selectively coupled to a corresponding bit line of said pair of first bit lines according to a voltage level of a first word line;
    a second memory array including a second memory cell and a pair of second bit lines, said second memory cell being selectively coupled to a corresponding bit line of said pair of second bit lines according to a voltage level of a second word line;
    a pair of first column lines selectively coupled to said pair of first bit lines or said pair of second bit lines, said pairs of first and second bit lines being located between the first column lines of said pair of first column lines;
    a coupling control circuit that provides control to selectively couple said pair of first column lines to said pair of first bit lines or said pair of second bit lines according to first select information;

a first read register selectively coupled to said pair of first column lines; and a read control circuit that provides control to selectively couple said first read register to at least one column line of said pair of first column lines according to a second select information.

2. The serial access memory according to claim 1, further comprising:

a write register which is selectively coupled to said pair of first column lines;

a write control circuit that provides control to selectively couple at least one column line of said pair of first column lines to said write register according to a third select information;

an input circuit which is coupled to said write register; and an output circuit which is coupled to said first read register.

3. The serial access memory according to claim 1, wherein said first memory array and said second memory array are located side by side, said pair of first column lines is located across said first and second memory arrays and across said first and second word lines.

4. The serial access memory according to claim 1, wherein said first memory array further includes a third memory cell and a pair of third bit lines, and said second memory array further includes a fourth memory cell and a pair of fourth bit lines, the serial access memory further comprising a pair of second column lines which is selectively coupled to said pair of third bit lines or said pair of fourth bit lines, wherein the third memory cell is selectively coupled to a corresponding bit line of said pair of third bit lines according to a voltage level of said first word line, wherein the fourth memory cell is selectively coupled to a corresponding bit line of said pair of fourth bit lines according to a voltage level of said second word line, wherein said pairs of third and fourth bit lines are located between the second column lines of said pair of second column lines, wherein said coupling control circuit provides control to selectively couple said pair of first column lines to said pair of first bit lines or said pair of second bit lines, and to selectively couple said pair of second column lines to said pair of third bit lines or said pair of fourth bit lines, according to the first select information, and wherein said read control circuit provides control to selectively couple said read register to said pair of first column lines or said pair of second column lines according to the second select information.

5. The serial access memory according to claim 4, further comprising:

a write register which is selectively coupled to said pair of first column lines;

a write control circuit that provides control to selectively couple said write register to said pair of first column lines or said pair of second column lines according to the third select information;

an input circuit which is coupled to said write register; and an output circuit which is coupled to said read register.

6. The serial access memory according to claim 1, further comprising a second read register which is selectively coupled to said pair of first column lines, wherein said read control circuit provides control to selectively couple said first read register or said second read register to said pair of first column lines according to the second select information.

7. The serial access memory according to claim 6, further comprising a first output circuit which is selectively coupled to said first read register and a second output circuit which is selectively coupled to said second read register.

8. The serial access memory according to claim 7, wherein said read control circuit provides control to selectively couple said second read register to at least one column line of said pair of first column lines according to the second select information.

9. A serial access memory comprising:

a first memory array including a first memory cell and a pair of first bit lines, said first memory cell being selectively coupled to a corresponding bit line of said pair of first bit lines according to a voltage level of a first word line;

a second memory array including a second memory cell and a pair of second bit lines, said second memory cell being selectively coupled to a corresponding bit line of said pair of second bit lines according to a voltage level of a second word line;

a first column line selectively coupled to a bit line of said pair of first bit lines or a bit line of said pair of second bit lines;

a coupling control circuit that provides control to selectively couple said first column line to the bit line of said pair of first bit lines or the bit line of said pair of second bit lines according to first select information;

a read register selectively coupled to said first column line; and a read control circuit that provides control to selectively couple said read register to said first column line according to second select information.

10. The serial access memory according to claim 9, further comprising:

a write register which is selectively coupled to said first column line;

a write control circuit that provides control to selectively couple said first column line to said write register according to a third select information;

an input circuit which is coupled to said write register; and an output circuit which is coupled to said read register.

11. The serial access memory according to claim 10, wherein said first memory array and said second memory array are located side by side, said column line is located across said first and second memory arrays and across said first and second word lines.

12. The serial access memory according to claim 9, wherein said first memory array further includes a third memory cell and a pair of third bit lines, and said second memory array further includes a fourth memory cell and a pair of fourth bit lines, wherein said pairs of third and fourth bit lines are located between said first column line and another column line, wherein the third memory cell is selectively coupled to a corresponding bit line of said pair of third bit lines according to the voltage level of said first word line, wherein the fourth memory cell is selectively coupled to a corresponding bit line of said pair of fourth bit lines according to the voltage level of said second word line, and wherein said coupling control circuit provides control to selectively couple said first column line to the bit line of said pair of first bit lines or the bit line of said pair of second bit lines, and to selectively couple said another column line to the bit line of said pair of third bit lines or the bit line of said pair of fourth bit lines, according to the first select information.

13. A serial access memory comprising:

a first memory array including a first memory cell and a pair of first bit lines, said first memory cell being selectively coupled to a corresponding bit line of said pair of first bit lines according to a voltage level of a first word line;

a second memory array including a second memory cell and a pair of second bit lines, said second memory cell being selectively coupled to a corresponding bit line of said pair of second bit lines according to a voltage level of a second word line;

a pair of column lines selectively coupled to said pair of first bit lines or said pair of second bit lines, said pairs of first and second bit lines being located between the column lines of said pair of column lines;

a coupling control circuit that provides control to selectively couple said pair of column lines to said pair of first bit lines or said pair of second bit lines according to a first select information;

a first register selectively coupled to said pair of first column lines; and a control circuit that provides control to selectively couple said first register to at least one column line of said pair of column lines according to a second select information.

14. The serial access memory according to claim 13, further comprising:

a second register which is selectively coupled to said pair of column lines; and a second control circuit that provides control to selectively couple at least one column line of said pair of column lines to said second register according to a third select information, wherein said first register and said first memory array are located side by side, and said second register and said second memory array are located side by side.

15. The serial access memory according to claim 14, wherein said first memory array is located between said second memory array and said first register, said second memory array is located between said first memory array and said second register, and said pair of column lines is located across said first and second memory arrays and across said first and second word lines.

16. The serial access memory according to claim 13, said pair of column lines comprises a first sub pair of column lines and a second sub pair of column lines, the serial access memory further comprising a transferring circuit which is coupled between said first and second sub pairs of column lines according to a control signal.

17. The serial access memory according to claim 16, wherein said first sub pair of column lines is electrically divided with respect to said second sub pair of column lines according to said control signal, whereby data of said first memory array is readable and writeable using said first sub pair of column lines and said first register independent of said second memory array, and data of said second memory array is readable and writeable using said second sub pair and said second register independent of said first memory array.

* * * * *